(12) United States Patent
Saxena et al.

(10) Patent No.: US 8,296,515 B1
(45) Date of Patent: Oct. 23, 2012

(54) RAID-6 COMPUTATION SYSTEM AND METHOD

(75) Inventors: Nirmal Raj Saxena, Los Altos Hills, CA (US); Mark A. Overby, Bothell, WA (US); Andrew Currid, Alameda, CA (US)

(73) Assignee: Nvidia Corporation, Santa Clara, CA (US)

( * ) Notice: Subject to any disclaimer, the term of this patent is extended or adjusted under 35 U.S.C. 154(b) by 489 days.

(21) Appl. No.: 12/639,736

(22) Filed: Dec. 16, 2009

Related U.S. Application Data

(63) Continuation-in-part of application No. 12/471,289, filed on May 22, 2009, now Pat. No. 8,037,391.

(51) Int. Cl.
*G06F 11/10* (2006.01)
*G06F 12/16* (2006.01)

(52) U.S. Cl. ........ 711/114; 714/6.24; 714/758; 714/759

(58) Field of Classification Search .................. None
See application file for complete search history.

(56) References Cited

U.S. PATENT DOCUMENTS

| | | | |
|---|---|---|---|
| 6,487,633 B1 | 11/2002 | Horst et al. | |
| 7,284,088 B2 | 10/2007 | Frolund et al. | |
| 7,310,703 B2 | 12/2007 | Frolund et al. | |
| 7,392,458 B2 | 6/2008 | Forhan et al. | |
| 7,441,146 B2 * | 10/2008 | Cavallo | 714/6.11 |
| 2005/0149683 A1 | 7/2005 | Chong et al. | |
| 2006/0123312 A1 | 6/2006 | Forhan et al. | |
| 2006/0123321 A1 | 6/2006 | Deenadhayalan et al. | |
| 2006/0218470 A1 | 9/2006 | Dickson | |
| 2007/0055905 A1 | 3/2007 | Chou et al. | |
| 2007/0094529 A1 * | 4/2007 | Lango et al. | 714/4 |
| 2007/0192544 A1 | 8/2007 | Frolund et al. | |
| 2008/0040415 A1 | 2/2008 | Forhan et al. | |
| 2008/0040416 A1 | 2/2008 | Forhan et al. | |
| 2008/0040542 A1 | 2/2008 | Forhan et al. | |
| 2008/0040646 A1 | 2/2008 | Forhan et al. | |
| 2008/0046648 A1 | 2/2008 | Forhan et al. | |
| 2008/0115017 A1 | 5/2008 | Jacobson | |
| 2008/0201608 A1 | 8/2008 | Forhan et al. | |
| 2008/0221856 A1 | 9/2008 | Dubnicki et al. | |
| 2008/0229148 A1 | 9/2008 | Forhan et al. | |
| 2008/0229155 A1 | 9/2008 | Forhan et al. | |
| 2008/0270878 A1 | 10/2008 | He et al. | |
| 2009/0083590 A1 | 3/2009 | Wylie et al. | |
| 2010/0083069 A1 | 4/2010 | Wylie et al. | |
| 2010/0094921 A1 | 4/2010 | Roy et al. | |
| 2010/0115335 A1 | 5/2010 | Wylie et al. | |
| 2010/0158241 A1 | 6/2010 | Gueron | |
| 2010/0235677 A1 | 9/2010 | Wylie et al. | |

OTHER PUBLICATIONS

Anvin, Peter H. "The Mathematics of RAID-6," Mar. 13, 2007.
Plank, James S. "A Tutorial on Reed-Solomon Coding for Fault-Tolerance in RAIN-like Systems," Technical Report CS-96-332, Univ. of Tenn., 1999.
Blelloch, Guy. "Prefix Sums and Their Applications," CMU-CS-90-190, Carggegie Mellon University, Nov. 1990.
Office Action. U.S. Appl. No. 12/471,289, dtd. Oct. 19, 2010.
Office Action. U.S. Appl. No. 12/471,289, dated Apr. 1, 2011.

* cited by examiner

*Primary Examiner* — Gary Portka
(74) *Attorney, Agent, or Firm* — Patterson & Sheridan, LLP

(57) ABSTRACT

One embodiment of the present invention sets forth a technique for performing RAID-6 computations using simple arithmetic functions and two-dimensional table lookup operations. A set of threads within a multi-threaded processor are assigned to perform RAID-6 computations in parallel on a stripe of RAID-6 data. A set of lookup tables are stored within the multi-threaded processor for access by the threads in performing the RAID-6 computations. During normal operation of a related RAID-6 disk array, RAID-6 computations may be performed by the threads using a small set of simple arithmetic operations and a set of lookup operations to the lookup tables. Greater computational efficiency is gained by reducing the RAID-6 computations to simple operations that are performed efficiently on a multi-threaded processor, such as a graphics processing unit.

25 Claims, 15 Drawing Sheets

RAID-6 COMPUTATION SYSTEM AND METHOD

RELATED APPLICATIONS

This application is a continuation-in-part of the U.S. patent application titled, "RAID-6 Computation System and Method", filed on May 22, 2009 now U.S. Pat. No. 8,037,391 and having Ser. No. 12/471,289. The substance of this related application is hereby incorporated herein by reference.

BACKGROUND OF THE INVENTION

1. Field of the Invention

The present invention generally relates to redundant array of independent disks (RAID) systems and more specifically to a RAID-6 computation system and method.

2. Description of the Related Art

Certain storage systems require total storage capacity and overall performance beyond that of one independent disk drive, for a given generation of disk drive technology. These storage systems typically organize a plurality of independent disk drives into a parallel array of disk drives, wherein multiple blocks of data may be accessed simultaneously by accessing the multiple disk drives in parallel. While a parallel array of disk drives provides increased storage capacity and generally increased performance, the mean time to failure (MTTF) of the array degrades proportionately with an increasing number of independent disk drives. For example, if a single disk drive has an MTTF of F and an array of disks includes N disks, then the MTTF of the array is approximately F/N. To protect data stored on the array of disks from a degraded MTTF, fault recovery mechanisms are typically employed. A redundant array of independent disks (RAID) array refers to a set of well known techniques for organizing data storage in a disk array of substantially identical disk drives that can provide fault recovery and improve overall MTTF of the disk array.

One RAID organization known in the art is "RAID-6," in which N participating disk drives in a disk array can store an equivalent capacity of N−2 disk drives of user data. An equivalent capacity of two disk drives of related error recovery data ("erasure code" data) provides fault protection for the N disk drives. One property of conventional RAID-6 is that two additional independent disk drives of storage can protect up to 255 equivalently sized disk drives of user data. Another property of conventional RAID-6 is that up to two disk drives may simultaneously fail without loss of data in the disk array. One assumption is that the RAID-6 system can identify each failed disk drive.

Data in a RAID-6 disk array of N disk drives is organized as a plurality of stripes that each includes N sectors. Each stripe includes one sector per disk drive, and the sectors of a given stripe share a common sector offset value within a respective disk drive. For a given stripe, N−2 sectors store user data and two sectors store fault recovery data, known as "erasure code bytes," which may be used to protect associated user data in the stripe. Two types of erasure code bytes, referred to as "P code bytes" and "Q code bytes," are stored within the two sectors of fault recovery data. The P code bytes are computed as an exclusive-OR sum of N−2 bytes of user data sharing an identical byte offset within each of N−2 sectors in a given stripe. Hence, each disk drive contributes one byte to a P code byte of a corresponding byte offset. A corresponding Q code byte is computed from the same set of N−2 bytes of user data. The Q code byte is computed as an exclusive-OR sum of N−2 terms, where each term is computed by multiplying a corresponding byte of user data by a coefficient that is a function of sector number and drive position in the disk array, wherein the multiplication operation is performed in a Galois Field $GF(2^8)$ as an extension field over $GF(2)$.

Persons skilled in the art will recognize that with one P code byte, one Q code byte, and N−2 bytes of user data in a stripe, any two bytes from the N byte stripe may be lost (erased) and the N−2 bytes of user data may be, nonetheless, recovered. As a result, any two disk drives within a RAID-6 array may fail, causing the RAID-6 array to operate in a compromised mode, but a without loss of user data. Furthermore, replacement drives may be installed within the RAID-6 array and populated with recovered data during a recovery mode.

While a RAID-6 disk array can continue to operate in a compromised or recovery mode without loss of user data, the associated computational load needed to continue operating may become a significant burden for a host processor. In certain practical RAID-6 scenarios, forward progress of user applications accessing a compromised RAID-6 array can be almost completely stymied by complex RAID-6 computations needed to access to the compromised array.

Accordingly, what is needed in the art is a technique that enables more efficient RAID-6 computations.

SUMMARY OF THE INVENTION

One embodiment of the present invention sets forth a computer-implemented method for computing erasure codes for a redundant array of independent disks (RAID). The method includes the steps of storing user data associated with a RAID stripe that is defined by a data block common to each disk in the redundant array, wherein, for each byte offset within the data block, user data associated with only N−2 disks is stored, N being the number of disks in the redundant array, and wherein a sliver comprises a set of S bytes per disk within the stripe at a common sliver offset within each disk, calculating a sliver offset for accessing an assigned sliver based on a thread identification number, computing a first erasure code by accumulating a plurality of values generated by performing, across each disk in the redundant array, a first exclusive-or operation based on the byte offset within the assigned sliver; for each byte offset within the assigned sliver, computing a second erasure code by accumulating a plurality of values generated by performing, across each disk in the redundant array, a second exclusive-or operation based on a look-up table value; and, for each byte offset within the assigned sliver, storing the first erasure code and the second erasure code along with the user data associated with the N−2 disks.

One advantage of the disclosed method is that otherwise complex RAID-6 computations are simplified to efficient arithmetic instructions and basic table lookup operations, thereby reducing computational complexity and improving overall system efficiency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

System Overview

Figure 1:
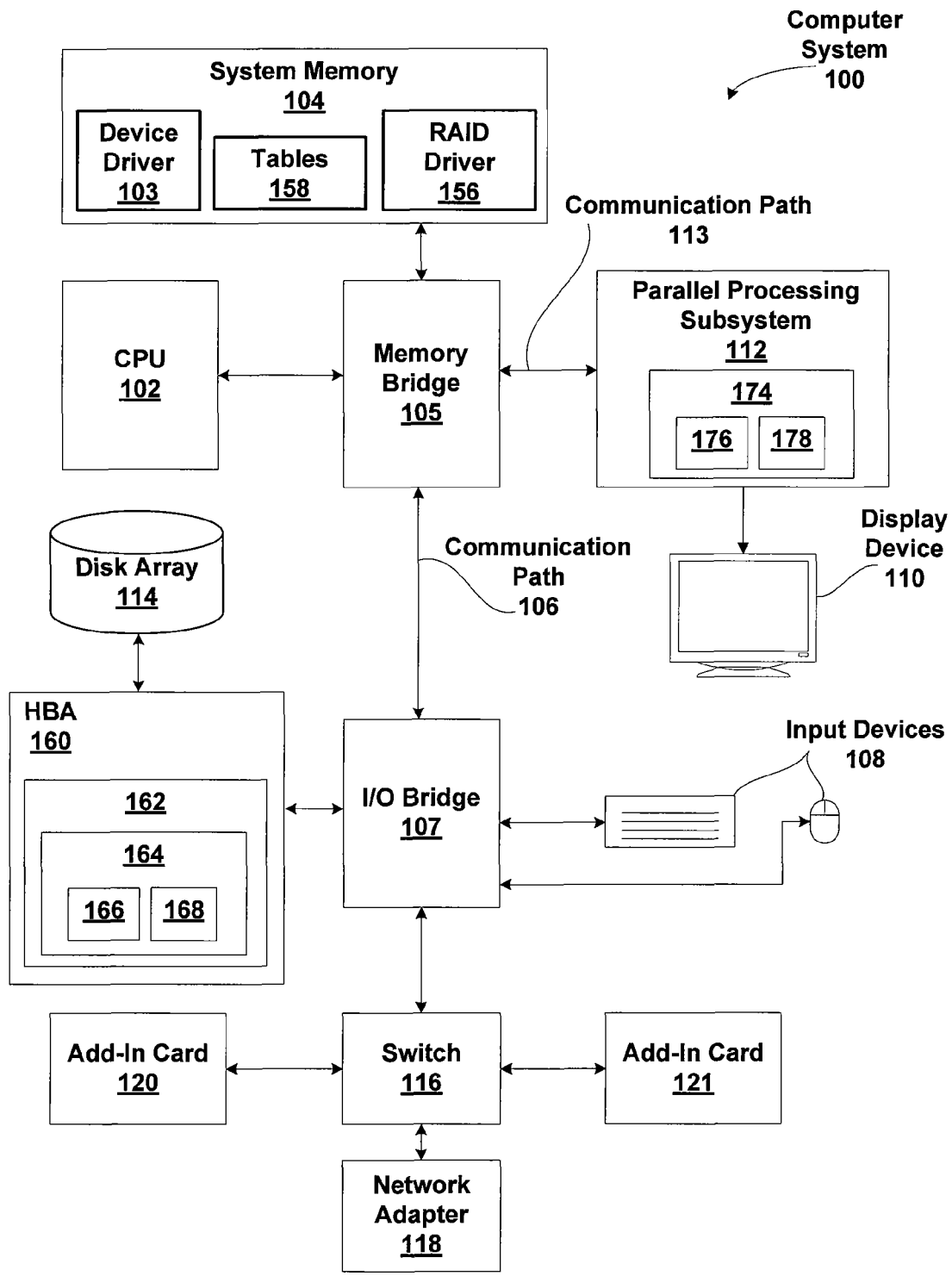
FIG. 1 is a block diagram illustrating a computer system configured to implement one or more aspects of the present invention.

FIG. 1 is a block diagram illustrating a computer system 100 configured to implement one or more aspects of the present invention. Computer system 100 includes a central processing unit (CPU) 102 and a system memory 104 communicating via a bus path that may include a memory bridge 105. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, may receive user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a PCI Express, Accelerated Graphics Port, or HyperTransport link); in one embodiment parallel processing subsystem 112 is a graphics subsystem that delivers pixels to a display device 110 (e.g., a conventional CRT or LCD based monitor). A disk array 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107 and memory bridge 105. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC). A device driver 103 within system memory 104 may be used to manage the parallel processing subsystem 112. For example, the device driver 103 may be used to load data or programs into parallel processing (PP) memory 174 within the parallel processing subsystem.

The I/O bridge 107 may be coupled to a disk array 114 directly, through an interface multiplexer (not shown), or via a host bus adapter (HBA) 160, configured to act as an interface between the I/O bridge 107 and one or more mass storage devices comprising the disk array. Each mass storage device, such as a hard disk drive or flash memory drive, may be configured with a storage subsystem interface such as an industry standard serial advanced technology attachment (SATA) interface. In one embodiment, the HBA 160 includes a processing unit 162 configured to include a memory subsystem 164, which may include a redundant array of independent disks (RAID) software module 166 configured to perform RAID computations, and a set of tables 168, discussed in greater detail below, configured to aid in the RAID computations performed by the RAID software module 166. For example, the RAID software module 166 may be configured to perform RAID-6 computations.

In one embodiment, the parallel processing subsystem 112 includes a parallel processor (PP) memory 174, which may include a RAID software module 176 configured to perform RAID computations, and a set of tables 178, discussed in greater details below, configured to aid in the RAID computation performed by the RAID software module 176. For example, the RAID software module 176 may be configured to perform RAID-6 computations.

A RAID driver 156 within system memory 104 may be configured to manage access to the disk array 114. In one embodiment, the RAID driver 156 is configured to processes access requests to the disk array 114 and to perform RAID computations, such as RAID-6 computations, with respect to the access requests and the disk array 114. When the RAID driver 156 receives a write command and associated write data from a user application (not shown), the RAID driver 156 transforms the write data into a RAID-encoded representation, which maps onto a set of blocks within the disk array 114. Each corresponding block of RAID-encoded data may then be written to the disk array 114 or placed in a write queue to be written at a later time. When the RAID driver 156 receives a read request from the user application for a particular block of user data from the disk array 114, the RAID driver 156 retrieves a corresponding block of user data from the disk array 114 and transmits the block of user data to the user application. If the disk array is operating in a compromised mode, then the RAID driver 156 may need to reconstruct the requested block of user data. If the requested block of user data maps to a failed drive, then the RAID driver 156 may reconstruct the requested block of user data from a set of related blocks, including blocks of error recovery data.

In alternative embodiments, the RAID driver 156 is configured to receive access requests to the disk array 114 and to transmit the requests to the parallel processing subsystem 112 for processing that includes performing RAID computations, such as RAID-6 computations within the parallel processing subsystem 112. In other alternative embodiments, the RAID driver 156 is configured to receive access requests to the disk array 114 and to transmit the requests to the HBA 160 for processing that includes performing RAID computations, such as RAID-6 computations within the HBA 160.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
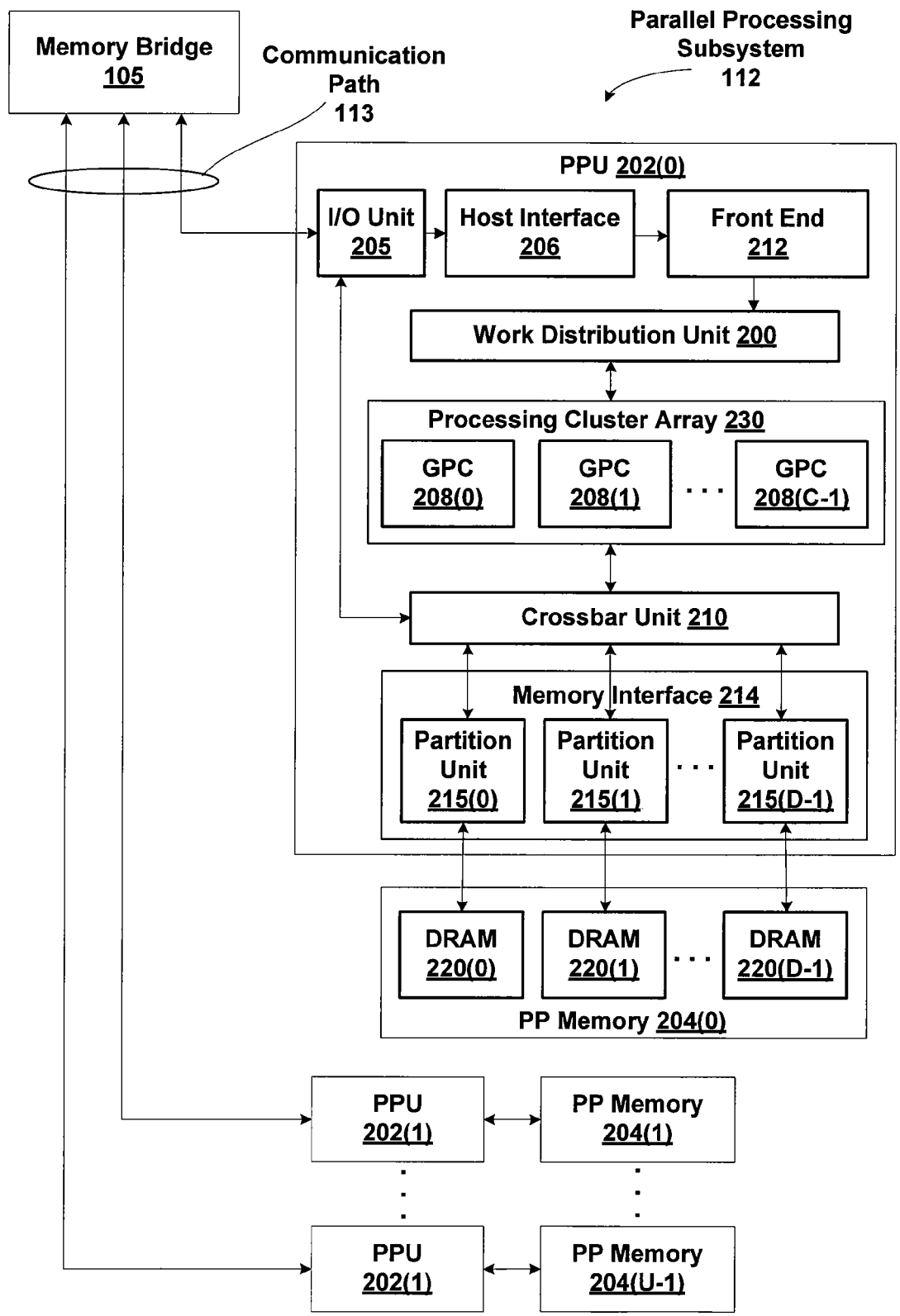
FIG. 2 is a block diagram of a parallel processing subsystem for the computer system of FIG. 1, according to one embodiment of the present invention.

FIG. 2 illustrates a parallel processing subsystem 112, according to one embodiment of the present invention. As shown, parallel processing subsystem 112 includes one or more parallel processing units (PPUs) 202, each of which is coupled to a local parallel processing (PP) memory 204. In general, a parallel processing subsystem includes a number U of PPUs, where $U \geq 1$. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104 via memory bridge 105 and bus 113, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a pushbuffer (not explicitly shown in either FIG. 1 or FIG. 2) that may be located in system memory 104, parallel processing memory 204, or another storage location accessible to both CPU 102 and PPU 202. PPU 202 reads the command stream from the pushbuffer and then executes commands asynchronously relative to the operation of CPU 102.

Referring back now to FIG. 2, each PPU 202 includes an I/O (input/output) unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCI-E link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each pushbuffer and outputs the work specified by the pushbuffer to a front end 212.

Each PPU 202 advantageously implements a highly parallel processing architecture. As shown in detail, PPU 202(0) includes a processing cluster array 230 that includes a number C of general processing clusters (GPCs) 208, where $C \geq 1$. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary dependent on the workload arising for each type of program or computation.

GPCs 208 receive processing tasks to be executed via a work distribution unit 200, which receives commands defining processing tasks from front end unit 212. Processing tasks include indices of data to be processed, e.g., surface (patch) data, primitive data, vertex data, and/or pixel data, as well as state parameters and commands defining how the data is to be processed (e.g., what program is to be executed). Work distribution unit 200 may be configured to fetch the indices corresponding to the tasks, or work distribution unit 200 may receive the indices from front end 212. Front end 212 ensures that GPCs 208 are configured to a valid state before the processing specified by the pushbuffers is initiated.

When PPU 202 is used for graphics processing, for example, the processing workload for each patch is divided into approximately equal sized tasks to enable distribution of the tessellation processing to multiple GPCs 208. A work distribution unit 200 may be configured to produce tasks at a frequency capable of providing tasks to multiple GPCs 208 for processing. By contrast, in conventional systems, processing is typically performed by a single processing engine, while the other processing engines remain idle, waiting for the single processing engine to complete its tasks before beginning their processing tasks. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. Intermediate data produced by GPCs 208 may be stored in buffers to allow the intermediate data to be transmitted between GPCs 208 for further processing.

Memory interface 214 includes a number D of partition units 215 that are each directly coupled to a portion of parallel processing memory 204, where $D \geq 1$. As shown, the number of partition units 215 generally equals the number of DRAM 220. In other embodiments, the number of partition units 215 may not equal the number of memory devices. Persons skilled in the art will appreciate that DRAM 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the partition units 215 within parallel processing memory 204. Crossbar unit 210 is configured to route the output of each GPC 208 to the input of any partition unit 214 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCI-E) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more of PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Processing Cluster Array Overview

Figure 3A:
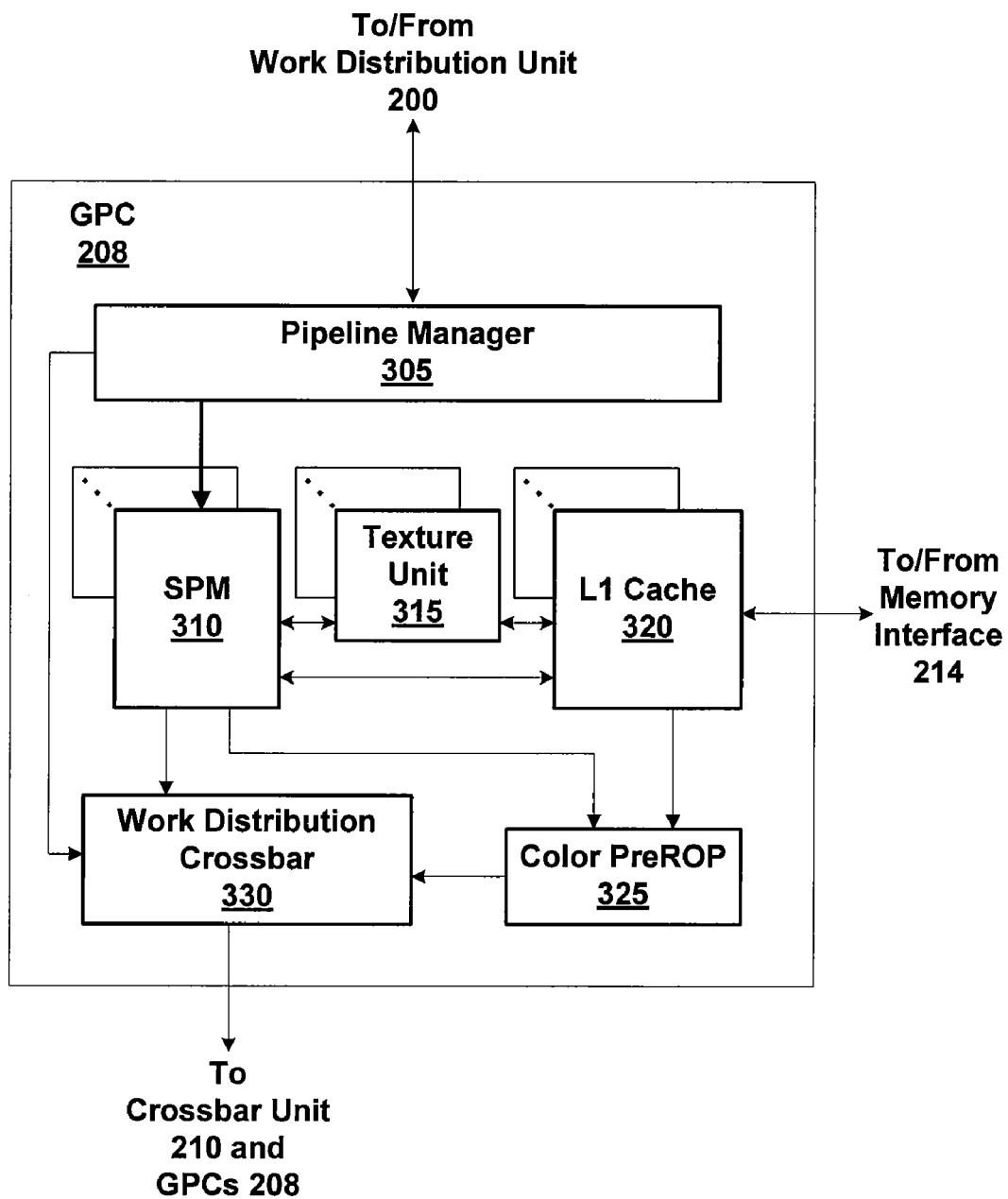
FIG. 3A is a block diagram of a GPC within one of the PPUs of FIG. 2, according to one embodiment of the present invention.

FIG. 3A is a block diagram of a GPC 208 within one of the PPUs 202 of FIG. 2, according to one embodiment of the present invention. Each GPC 208 may be configured to execute a large number of threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the GPCs 208. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

In graphics applications, a GPU 208 may be configured to implement a primitive engine 304 for performing screen space graphics processing functions that may include, but are not limited to primitive setup, rasterization, and z culling. In some embodiments, primitive engine 304 is configured to gather pixels into tiles of multiple neighboring pixels before outputting the pixels to L1 cache 320 in order to improve the access efficiency of L1 cache 320. Primitive engine 304 receives a processing task from work distribution unit 200, and when the processing task does not require the operations performed by primitive engine 304, the processing task is passed through primitive engine 304 to a pipeline manager 305. Operation of GPC 208 is advantageously controlled via a pipeline manager 305 that distributes processing tasks to streaming multiprocessors (SPMs) 310. Pipeline manager 305 may also be configured to control a work distribution crossbar 330 by specifying destinations for processed data output by SPMs 310.

In one embodiment, each GPC 208 includes a number M of SPMs 310, where M≧1, each SPM 310 configured to process one or more thread groups. Also, each SPM 310 advantageously includes an identical set of functional units (e.g., arithmetic logic units, etc.) that may be pipelined, allowing a new instruction to be issued before a previous instruction has finished, as is known in the art. Any combination of functional units may be provided. In one embodiment, the functional units support a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.); and the same functional-unit hardware can be leveraged to perform different operations.

The series of instructions transmitted to a particular GPC 208 constitutes a thread, as previously defined herein, and the collection of a certain number of concurrently executing threads across the parallel processing engines (not shown) within an SPM 310 is referred to herein as a "warp" or "thread group." As used herein, a "thread group" refers to a group of threads concurrently executing the same program on different input data, with one thread of the group being assigned to a different processing engine within an SPM 310. A thread group may include fewer threads than the number of processing engines within the SPM 310, in which case some processing engines will be idle during cycles when that thread group is being processed. A thread group may also include more threads than the number of processing engines within the SPM 310, in which case processing will take place over consecutive clock cycles. Since each SPM 310 can support up to G thread groups concurrently, it follows that up to G*M thread groups can be executing in GPC 208 at any given time.

Additionally, a plurality of related thread groups may be active (in different phases of execution) at the same time within an SPM 310. This collection of thread groups is referred to herein as a "cooperative thread array" ("CTA"). The size of a particular CTA is equal to m*k, where k is the number of concurrently executing threads in a thread group and is typically an integer multiple of the number of parallel processing engines within the SPM 310, and m is the number of thread groups simultaneously active within the SPM 310. The size of a CTA is generally determined by the programmer and the amount of hardware resources, such as memory or registers, available to the CTA.

Each SPM 310 uses space in a corresponding L1 cache 320 that is used to perform load and store operations. Each SPM 310 also has access to L2 caches within the partition units 215 that are shared among all GPCs 208 and may be used to transfer data between threads. Finally, SPMs 310 also have access to off-chip "global" memory, which can include, e.g., parallel processing memory 204 and/or system memory 104. It is to be understood that any memory external to PPU 202 may be used as global memory.

In graphics applications, a GPC 208 may be configured such that each SPM 310 is coupled to a texture unit 315 for performing texture mapping operations, e.g., determining texture sample positions, reading texture data, and filtering the texture data. Texture data is read from L1 cache 320 and is fetched from an L2 cache, parallel processing memory 204, or system memory 104, as needed. Each SPM 310 outputs processed tasks to work distribution crossbar 330 in order to provide the processed task to another GPC 208 for further processing or to store the processed task in an L2 cache, parallel processing memory 204, or system memory 104 via crossbar unit 210. A color preROP (pre-raster operations) 325 is configured to perform optimizations for color blending, organize pixel color data, and perform address translations.

It will be appreciated that the core architecture described herein is illustrative and that variations and modifications are possible. Any number of processing engines, e.g., primitive engines 304, SPMs 310, texture units 315, or color preROPs 325 may be included within a GPC 208. Further, while only one GPC 208 is shown, a PPU 202 may include any number of GPCs 208 that are advantageously functionally similar to one another so that execution behavior does not depend on which GPC 208 receives a particular processing task. Further, each GPC 208 advantageously operates independently of other GPCs 208 using separate and distinct processing engines, L1 caches 320, and so on.

Figure 3B:
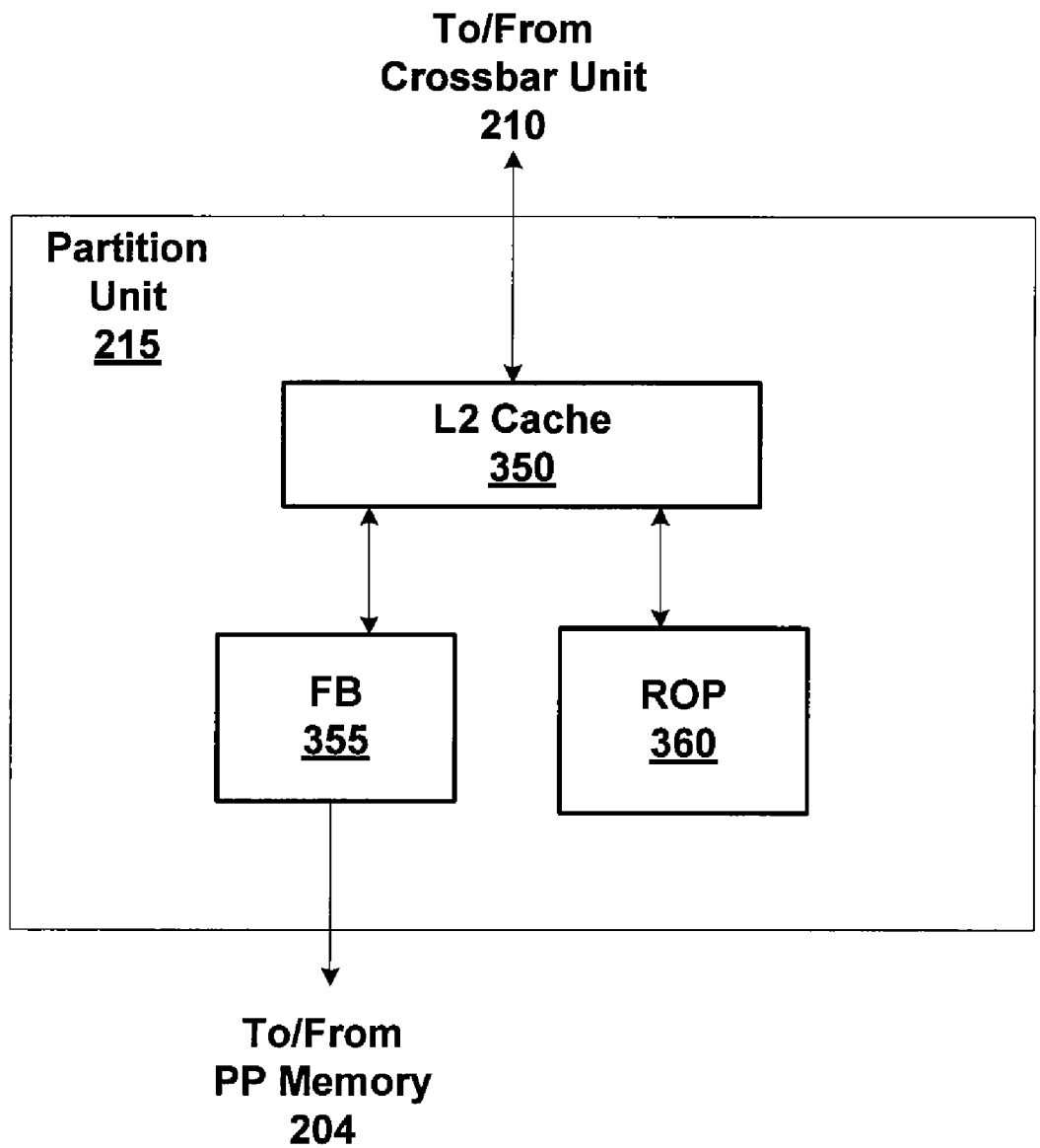
FIG. 3B is a block diagram of a partition unit within one of the PPUs of FIG. 2, according to one embodiment of the present invention.

FIG. 3B is a block diagram of a partition unit 215 within one of the PPUs 202 of FIG. 2, according to one embodiment of the present invention. As shown, partition unit 215 includes a L2 cache 350, a frame buffer (FB) 355, and a raster operations unit (ROP) 360. L2 cache 350 is a read/write cache that is configured to perform load and store operations received from crossbar unit 210 and ROP 360. In some embodiments, L2 cache 350 may be split into four (or fewer) slices in order to interface with memory crossbar unit 210 at four times the bandwidth of FB 355. Read misses and urgent writeback requests are output by L2 cache 350 to FB 355 for processing. Dirty updates are also sent to FB 355 for opportunistic processing. FB 355 interfaces directly with parallel processing memory 204, outputting read and write requests and receiving data read from parallel processing memory 204.

In graphics applications, ROP 360 is a processing unit that performs raster operations, such as stencil, z test, and the like, and outputs pixel data as processed graphics data for storage in graphics memory. The processed graphics data may be displayed on display device 110 or routed for further processing by CPU 102 or by one of the processing entities within parallel processing subsystem 112. Each partition unit 215 includes a ROP 360 in order to distribute processing of the raster operations. In some embodiments, ROP 360 is configured to compress z or color data that is written to memory and decompress z or color data that is read from memory.

Persons skilled in the art will understand that the architecture described in FIGS. 1, 2, 3A and 3B in no way limits the scope of the present invention and that the techniques taught herein may be implemented on any properly configured processing unit, including, without limitation, one or more CPUs, one or more multi-core CPUs, one or more PPUs 202, one or more GPCs 208, one or more graphics or special purpose processing units, or the like, without departing the scope of the present invention.

RAID-6 Computation

Figure 4:
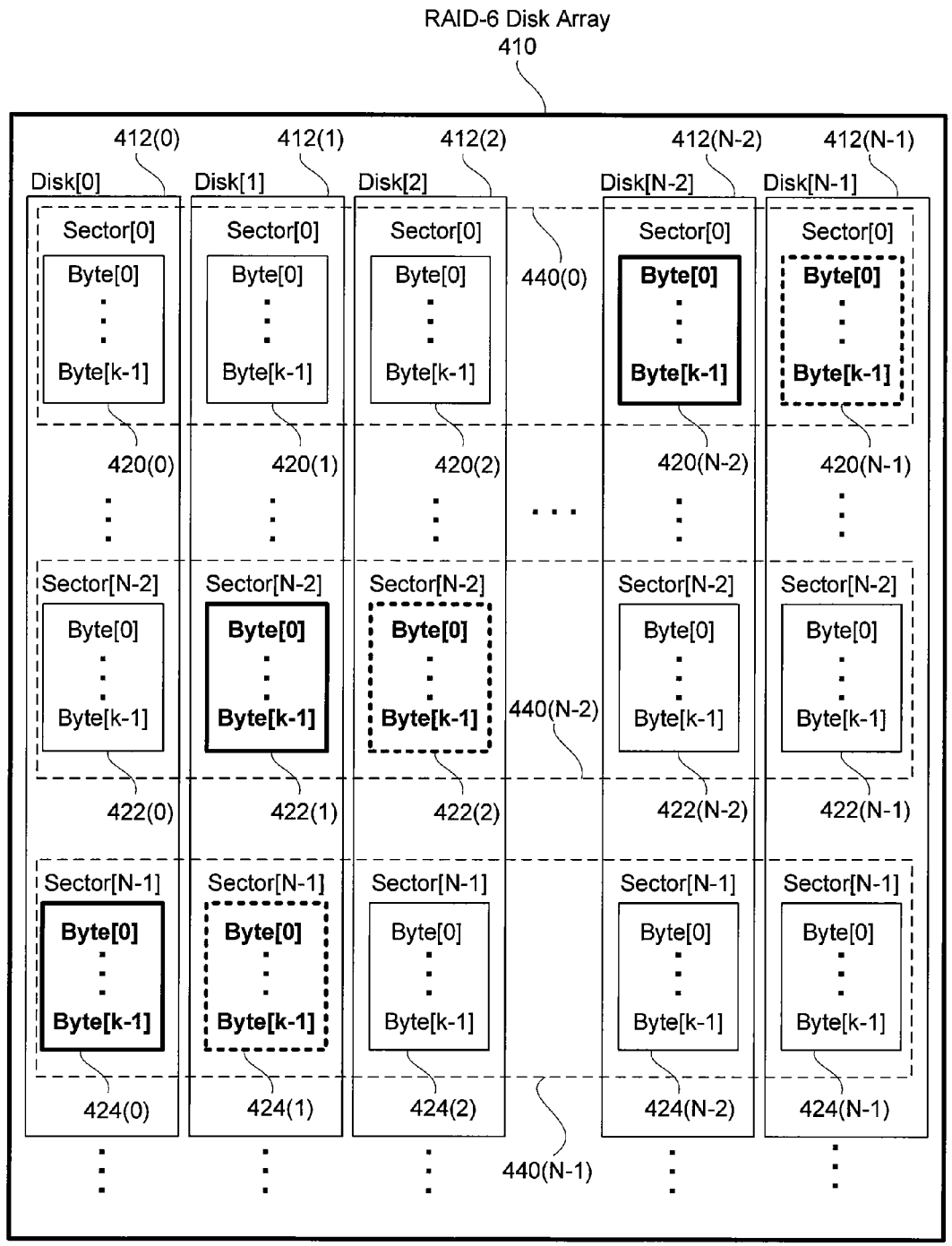
FIG. 4 illustrates a set of independent disk drives configured as a RAID-6 disk array, according to one embodiment of the present invention.

FIG. 4 illustrates a set of independent disk drives configured as a RAID-6 disk array 410, according to one embodiment of the present invention. The RAID-6 disk array 410 comprises N disk drives 412(0) through 412(N−1), labeled Disk[0] through Disk[N−1]. Each disk drive 412 may include an arbitrary number of total sectors, wherein each sector within the disk drive 412 is assigned a sequentially increasing offset value, typically starting with zero. Sectors within the disk drives 412 are organized into sets that are referred to as stripes. Each stripe 440 comprises a set of N sectors, typically characterized as having an equivalent offset value within each respective disk drive 412. For example, sectors 420(0) through 420(N−1) comprise stripe 440(0) at offset value 0, and sectors 424(0) through 424(N−1) comprise stripe 440(N−1) at offset value N−1. Stripes 440(0) through 440(N−1) comprise a first group of stripes. Additional groups of stripes may be allocated after stripe 440(N−1), for example beginning at a sector offset value of N. Groups of stripes may be allocated in repeating patterns with respect to stripes 440(0) through 440(N−1). Each sector comprises a set of k bytes, labeled Byte[0] through Byte[k−1]. Each byte within a sector is stored at a particular byte offset. Byte[0] is stored at a byte offset of zero within a given sector, while byte[k−1] is stored at a byte offset of k−1 within the sector. In certain embodiments, k is a power of two and each sector includes an integral power of two bytes.

Within each stripe 440, N−2 sectors are allocated to store user data and two sectors are allocated to store erasure code data, including P erasure code data and Q erasure code data. For example, sectors 420(0) through 420(2) may be allocated to store user data, sector 420(N−2) may store P erasure code data, and sector 420(N−1) may store Q erasure code date. As described later, the P erasure code data and Q erasure code data needs to be updated (written) whenever any sector of user data within the stripe is written. To reduce write bottlenecks in a particular disk drive associated with updates to P and Q erasure code data, the P erasure code data and Q erasure code data is typically rotated to adjacent disk drives in sequential stripes 440. For example, stripe 440(0) allocates sector 420(N−2) to store P erasure code data and sector 420(N−1) to store Q erasure code data, whereas stripe 440(N−2) allocates sector 422(1) to store P erasure code data and sector 422(2) to store Q erasure code data. Stripe 440(N−1) allocates sector 424(0) to store P erasure code data and sector 424(1) to store Q erasure code data. Persons skilled in the art will recognize that other techniques for rotating P and Q erasure code data through disk drives 412 may be implemented without departing from the present invention.

Each sector of P erasure code data comprises k bytes allocated to store P erasure code data for the associated stripe. These bytes are referred to as P erasure code bytes. Each sector of Q erasure code data comprises k bytes allocated to store the Q erasure code data for the associated stripe. These bytes are referred to as Q erasure code bytes. Within each stripe, P and Q erasure code bytes are calculated with respect to a given common byte offset over each sector in a given stripe. For example, in stripe 0, byte[0] from sectors 0 through N−3 are used to calculate one P erasure code byte that is stored in byte[0] of sector 420(N−2) and one Q erasure code byte stored in byte[0] of sector 420(N−1). Similarly, P and Q erasure code bytes may be calculated for each byte offset from zero through k. Each time user data is written to any sector within the stripe, a new set of P and Q erasure code bytes should be calculated and store in respective sectors.

To generate one P erasure code byte, bytes of user data from a specific byte offset within each disk drive 412 are accumulated using an XOR summation operation. Each P erasure code byte within a given sector allocated to store P erasure code data should be computed by performing an XOR summation operation over corresponding user code bytes. To generate one Q erasure code byte, bytes data from a specific byte offset from each disk drive 412 are first multiplied by matrix A to the power i, with the result added to an accumulated result using an XOR summation operation. Equation 1 illustrates how Qj, a Q erasure code byte within in a sector having a sector offset j, should be computed. In Equation 1, variable "i" indicates a disk drive number, "j" indicates a sector offset, and "d" indicates a byte data value on disk i with sector offset j.

$$Q_j = \sum_{all.drives.i} A^i \otimes d_{i,j} \quad \text{(Equation 1)}$$

The multiplication operator in Equation 1 takes place in a Galois field $GF(2^8)$ as an extension field over $GF(2)$. This extension can be formed using any primitive polynomial from a set of sixteen well known primitive polynomials, although the well known polynomial 0x1D is conventionally used in RAID-6 applications.

During normal operation of the RAID-6 disk array 410, a first disk, disk x, may fail. Furthermore, a second disk, disk y, may also fail during normal operation. One practical assumption is that if a given disk fails, the failure is known to a host system. Hence, x and y are known to the host system. For a given x and y disk drive failure, any combination of user data, Q erasure code data, or P erasure code data may be present on a failed drive, depending on which stripe is being accessed. Each loss scenario requires a specific recovery strategy.

In a scenario involving a single disk drive failure, one sector within a given stripe is "erased." Depending on how the erased sector from the failed drive aligns with the allocation of data within the corresponding stripe, the erased sector may store P erasure code data, Q erasure code data, or user data. In a scenario involving erased user data, an XOR summation operation taken over bytes within remaining user data sectors and the P erasure code data may be used to reconstruct the erased user data associated with one failed drive. In a scenario involving erased P erasure code data or Q erasure code data, the corresponding data may be recomputed from viable user data. In a two drive failure scenario involving P erasure code data and Q erasure code data, viable user data may be used to recomputed the erased P erasure code data and Q erasure code data.

In a scenario involving two simultaneous drive failures (on disk drives x and y) that result in erasure of two sectors of user data, a combined set of corresponding P erasure code data and Q erasure code data may be used to reconstruct the two erased sectors of user data. Equations 2 through 11 . . . detail steps that may be used to reconstruct two bytes of erased user data (one erased byte per erased sector) from one P erasure code byte and one Q erasure code byte. Each byte within an erased sector may be reconstructed using these steps. In Equation 2, a sum of viable data bytes, $P_{xy}$, is computed over a set of viable data bytes of user data $(d_i)$ from non-failed disk drives using a summation operation equivalent to the summation operation used to generate the P erasure code byte, except disk drives x and y are excluded.

$$P_{xy} = \sum_{i \neq x, i \neq y} d_i \quad \text{(Equation 2)}$$

As indicated in Equation 3, below, the sum of $P_{xy}$ and the P erasure code byte (P) is equivalent to the sum of the two erased data bytes, $d_x$ and $d_y$.

$$P \otimes P_{xy} = d_x \otimes d_y \quad \text{(Equation 3)}$$

In Equation 4, a sum of viable data bytes, $Q_{xy}$, is computed over a set of viable data bytes of user data ($d_i$) from non-failed disk drives using a summation operation equivalent to the summation operation of Equation 1 used to generate the Q erasure code byte, except disk drives x and y are excluded.

$$Q_{xy} = \sum_{i \neq x, i \neq y} A^i \otimes d_{i,j} \quad \text{(Equation 4)}$$

As indicated in Equation 5, below, the sum of $Q_{xy}$ and the Q erasure code byte (P) is equivalent to the sum of the products of each erased data byte multiplied by a respective result of A to the power i.

$$Q \otimes Q_{xy} = A^x \otimes d_x \otimes A^y \otimes d_y \quad \text{(Equation 5)}$$

In a more concise notation, $q_{xy} = A^x \otimes d_x \otimes A^y \otimes d_y$, and $p_{xy} = d_x \otimes d_y$. With this notation, Equations 3 and 5 are rewritten as Equations 6 and 7, below.

$$p_{xy} = d_x \otimes d_y \quad \text{(Equation 6)}$$

$$q_{xy} = A^x \otimes d_x \otimes A^y \otimes d_y \quad \text{(Equation 7)}$$

Multiplying both sides of Equation 7 by $A^{-x}$, yields Equation 8, below.

$$A^{-x} \otimes \otimes q_{xy} = d_x \otimes A^{y-x} \otimes d_y \quad \text{(Equation 8)}$$

Adding Equation 8 to Equation 6 yields Equation 8, below.

$$p_{xy} \otimes A^{-x} \otimes \otimes q_{xy} = (I \otimes A^{y-x}) \otimes d_y \quad \text{(Equation 9)}$$

Persons skilled in the art will recognize that $d_y$ may be isolated from Equation 9, to yield Equation 10, below.

$$d_y = (I \otimes A^{y-x})^{-1} \otimes (p_{xy} \otimes A^{-x} q_{xy}) \quad \text{(Equation 10)}$$

Adding $d_y$, isolated in Equation 10, to both sides of Equation 6 isolates $d_x$, as shown below in Equation 11.

$$d_x = d_y \otimes p_{xy} \quad \text{(Equation 11)}$$

At this point, both bytes of erased user data (on failed disk drives x and y) have been recovered. Importantly, all mathematical calculations may be performed with computed values $p_{xy}$, $q_{xy}$, and pre-computed tables that take i (an eight bit disk drive number), and $d_i$ (a byte of data on disk drive i) as inputs. Four pre-computed tables are required. The first pre-computed table is table T[i][b], which represents $A^i \otimes b$, where 'i' is a disk drive number, and 'b' is a byte of data stored on disk drive i at a certain byte offset. The second pre-computed table is invT[i][b], which represents $A^{-i} \otimes b$. The third pre-computed table is IpT[i][c], which represents $(I \otimes A^i) \otimes c$. The term 'c' represents a single byte value. The third pre-computed table is used to generate invlpT[i][d], which represents $(I \otimes A^i)^{-1} \otimes d$. The term 'd' represents a single byte value. Importantly, table input indices 'i,' 'b' 'c,' and 'd' may all be eight bit values. Each table receives two eight-bit indices and generates on eight-bit result.

Figure 5A:
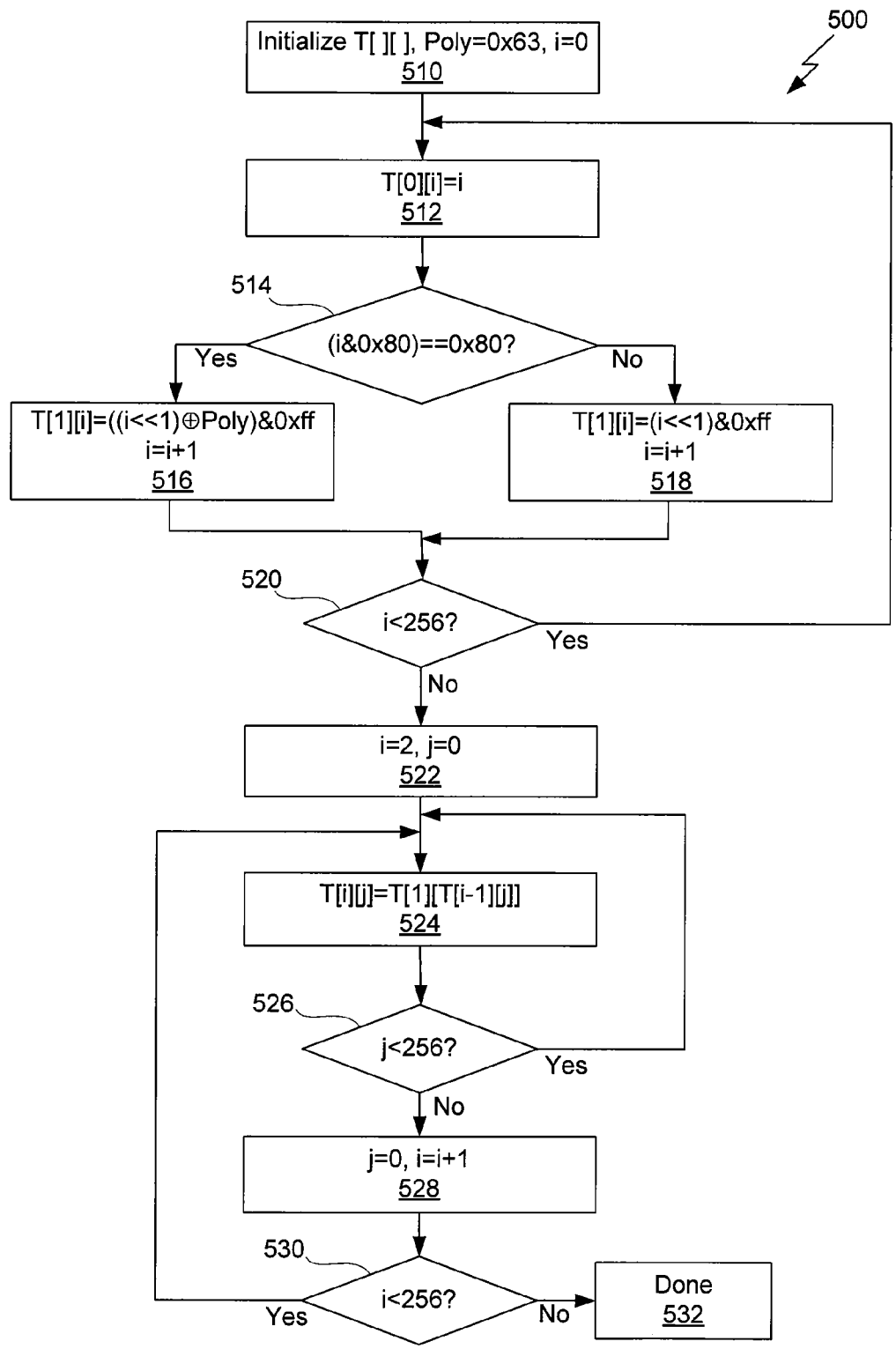
FIG. 5A is a flow diagram of method steps for computing a multiplication lookup table for RAID-6 computation, according to one embodiment of the invention.
Figure 5B:
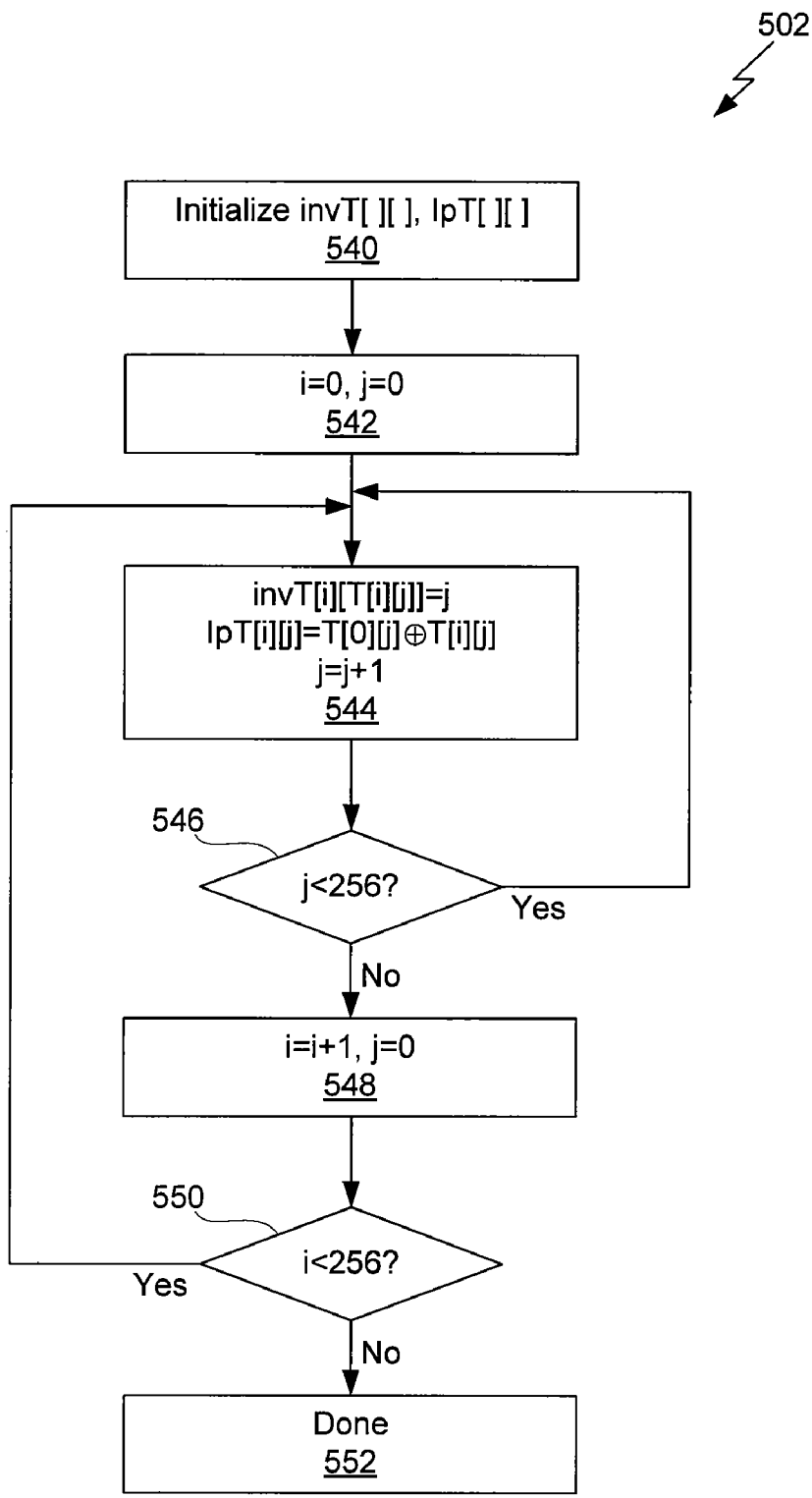
FIG. 5B is a flow diagram of method steps for computing a second and third lookup table for RAID-6 computations, according to one embodiment of the invention.
Figure 5C:
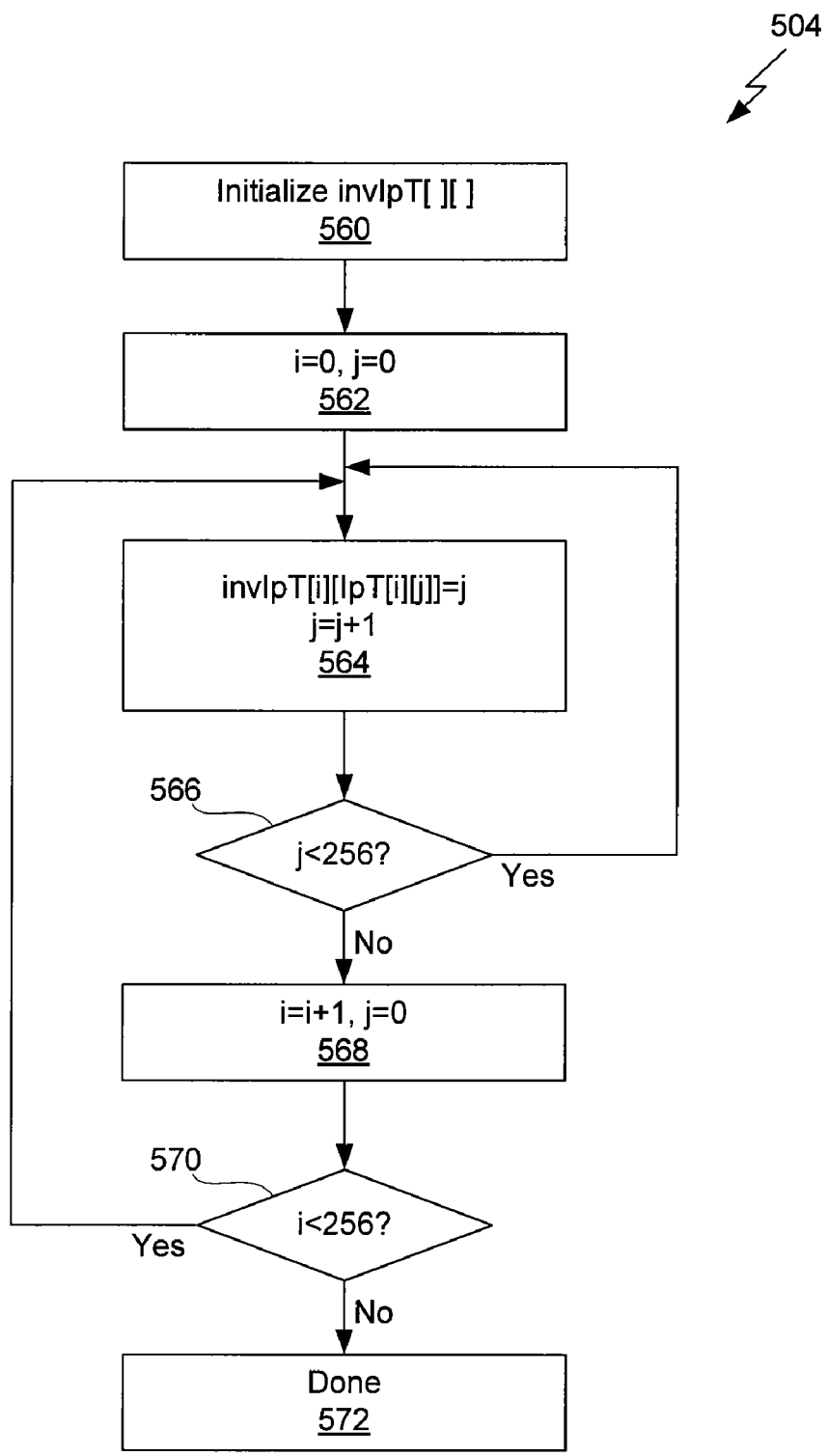
FIG. 5C is a flow diagram of method steps for computing a fourth lookup table for RAID-6 computations, according to one embodiment of the invention.
Figure 6:
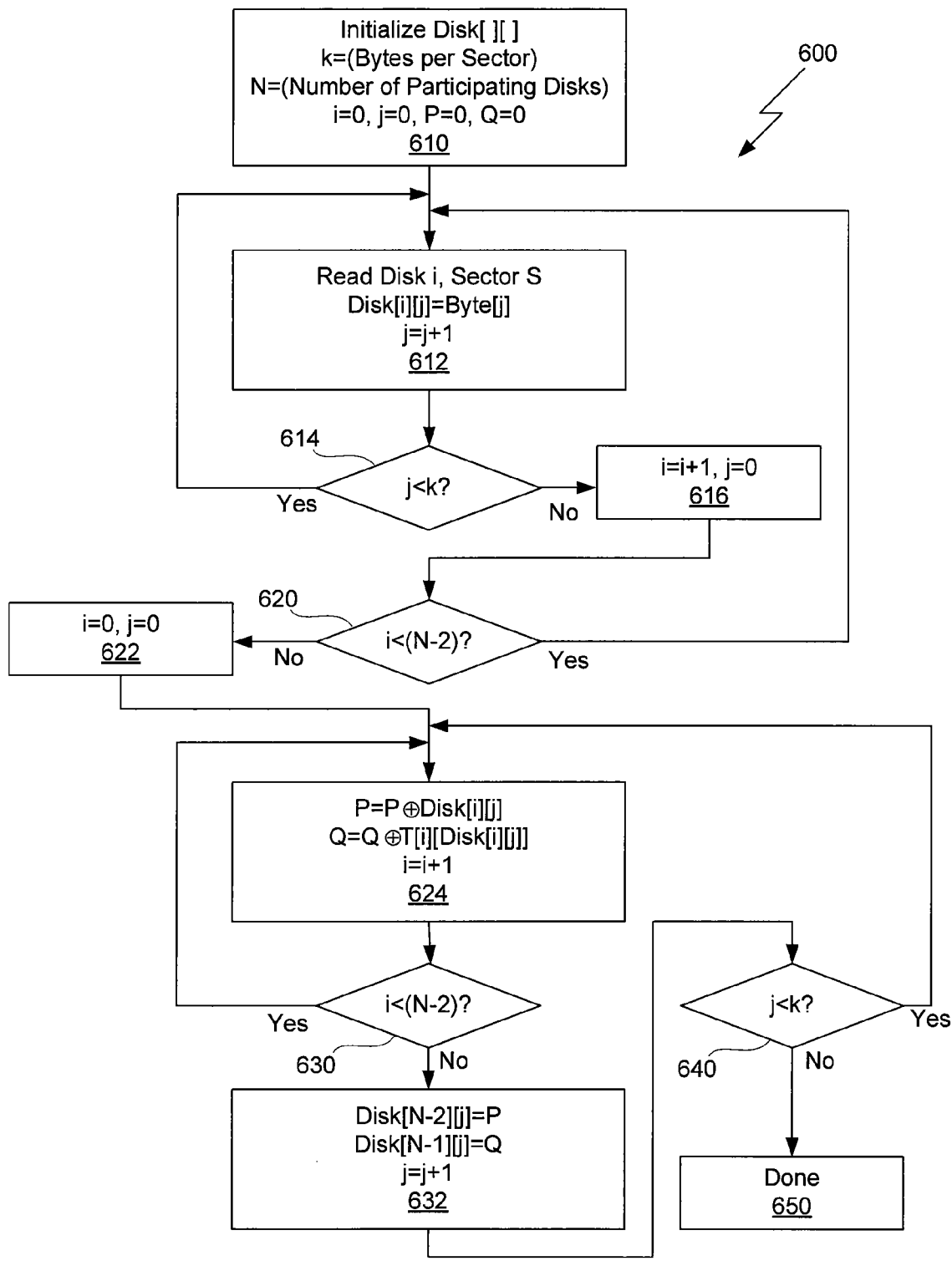
FIG. 6 is a flow diagram of method steps for generating erasure code bytes for a RAID-6 array using lookup tables, according to one embodiment of the invention.
Figure 7:
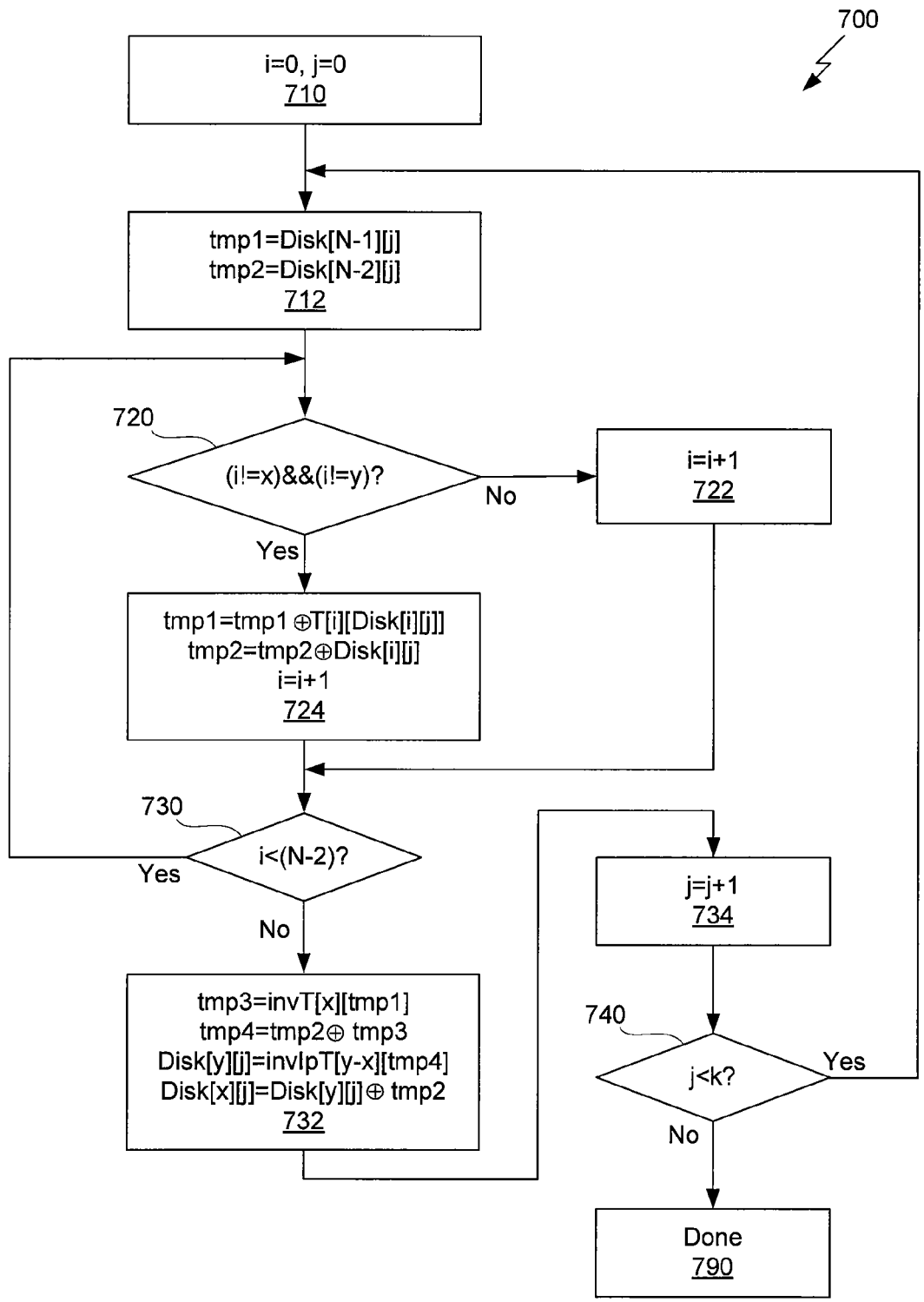
FIG. 7 is a flow diagram of method steps for reconstructing data from two failed drives using lookup tables, according to one embodiment of the invention.

Prior to normal operation of the RAID-6 disk array 410, each of the four pre-computed tables should be computed and stored in memory accessible to a processor responsible for RAID-6 computations. During normal operation, T[i][b] may be used to compute Q erasure code data. During a two disk failure, tables T[i][b], invT[i][b], and invlpT[i][d] may be used to compute user data bytes erased due to the disk failures. FIGS. 5A through 5C teach techniques for generating the four pre-computed tables. FIGS. 6 and 7 illustrate normal and recovery operating modes using the four pre-computed tables.

FIG. 5A is a flow diagram of method steps 500 for computing a multiplication lookup table for RAID-6 computation, according to one embodiment of the invention. Although the method steps are described in conjunction with the systems of FIGS. 1-4, persons skilled in the art will understand that any system configured to perform the method steps, in any order, is within the scope of the invention.

The method begins in step 510, where an array T[ ][ ] is initialized, a constant "poly" is set to a constant such as 0×63, and index variable i is set to zero. Initializing array T[ ][ ] may include allocating space in a memory system and may also include setting each array entry to zero. Persons skilled in the art will recognize that certain values for constant poly other than 0×63 may also be used. In step 512, array T[0][i] is set to a current value of i. If, in step 514, the most significant bit of the value stored in i is equal to one (that is (i&0×80)==(0× 80)), then the method proceeds to step 516, where array T[1][i] is set to ((i<<1) ⊗ poly)&0xff, where '⊗' specifies a bitwise XOR summation operation. In step 516, the index variable i is incremented by one.

Returning to step 514, if the most significant bit of the value stored in i is not equal to one, then the method proceeds to step 518, where array T[1][i] is set to (i<<1)&0xff and the index variable i is incremented by one.

If in step 520 the index variable i is less than 256, the method proceeds to step 512. Returning to step 520, if the index i is not less than 256, then the method proceeds to step 522. At this point, a first row of the array (T[0][ ]) has been written with a sequence of values from zero to 255 (0xFF) and a second row of the array (T[1][ ]) has been written with two different byte sequences. A first half of the second row of the array (T[1][0x00 . . . 0x7F]) has been written with a first byte sequence comprising a series of modifications to a binary representation of index variable i, and a second half of the second row (T[1][0x80 . . . 0xFF]) has been written with a second byte sequence comprising a series of modifications of a binary representation of the constant poly.

In step 522, index variable i is set to 2 and a second index variable j is set to 0. In step 524, T[i][j] is set to T[1][(T[i−1][j])]. In other words, an element within row i of array T[i][ ] is set to an element from the second row of array T[i][ ] that is selected by an entry within array T[ ][ ]. If, in step 526 index variable j is less than 256, the method proceeds to step 524.

Returning to step 526, if index variable j is not less than 256, the method proceeds to step 528, where index variable i is incremented and index variable j is set to zero. If, in step 520, index variable i is less than 256, then the method proceeds to step 524.

Returning to step 530, if index variable i is not less than 256, then the method terminates in step 532. At this point, each row subsequent to the second row is written with selected entries from the second row.

FIG. 5B is a flow diagram of method steps 502 for computing a second and third lookup table for RAID-6 computations, according to one embodiment of the invention. Although the method steps are described in conjunction with the systems of FIGS. 1-4, persons skilled in the art will understand that any system configured to perform the method steps, in any order, is within the scope of the invention.

The method begins in step 540, where arrays invT[i][j] and IpT[i][j] are initialized. Initializing arrays invT[i][j] and IpT[i][j] may include allocating space in a memory system and may also include setting each array entry to zero. In step 542, index variables i and j are set to zero. In step 544 array element invT[i][T[i][j]] is set to j. In other words, an element within row I of array invT[i][ ] that is selected by a value retrieved from T[ ][ ] is set to index variable j. Also in step 544, array element IpT[i][j] is set to T[0][i] ⊗ T[i][j]. In other words IpT[i][j] is set to a result of performing an XOR operation between an element from the first row and a selected column j of array T (T[0][j]) and a selected element of T[i][j]. Also in step 544, index variable j is subsequently incremented by one. If, in step 546, index variable j is less than 256, the method proceeds to step 544.

Returning to step 546, if index variable j is not less than 256, then the method proceeds to step 548, where index variable i is incremented by one and index variable j is set to zero. If, in step 550, index variable i is less than 256, the method proceeds to step 544.

Returning to step 550, if index variable i is not less than 256, the method terminates in step 552.

FIG. 5C is a flow diagram of method steps 504 for computing a fourth lookup table for RAID-6 computations, according to one embodiment of the invention. Although the method steps are described in conjunction with the systems of FIGS. 1-4, persons skilled in the art will understand that any system configured to perform the method steps, in any order, is within the scope of the invention.

The method begins in step 560, where array invlpT[i][j] is initialized. Initializing array invlpT[i][j] may include allocating space in a memory system and may also include setting each array entry to zero. In step 562, index variables i and j are set to zero. In step 564 array element invlpT[i][(IpT[i][i][j])] is set to j, and index variable j is subsequently incremented by one. In other words, an element within row i of array invlpT[i][ ] that is selected by a value retrieved from IpT[ ][ ] is set to index variable j. If, in step 566, index variable j is less than 256, the method proceeds to step 564.

Returning to step 566, if index variable j is not less than 256, then the method proceeds to step 568, where index variable i is incremented by one and index variable j is set to zero. If, in step 570, index variable i is less than 256, the method proceeds to step 564.

Returning to step 570, if index variable i is not less than 256, the method terminates in step 572.

Persons skilled in the art will recognize that the methods taught in FIGS. 5A thought 5C generate tables T[i][b], invT[i][b], IpT[i][c], and invlpT[i][d] appropriately for use in performing RAID-6 computations described in FIG. 4.

FIG. 6 is a flow diagram of method steps 600 for generating erasure code bytes for a RAID-6 array using lookup tables, according to one embodiment of the invention. Although the method steps are described in conjunction with the systems of FIGS. 1-4, persons skilled in the art will understand that any system configured to perform the method steps, in any order, is within the scope of the invention.

A memory array called disk[ ][ ] reflects data stored in one stripe of N disk drives within RAID-6 disk array 410. Each element of array disk[i][j] is a data byte from disk i at byte offset j at a given sector offset that specifies the stripe. Each sector includes k bytes of storage. Variable P refers to a P erasure code byte and variable Q refers to a Q erasure code byte.

The method begins in step 610, where array disk[ ][ ] is initialized, a process that may include allocating space in a memory subsystem, and may also include setting elements of disk[ ][ ] to a constant such as zero. Additionally, variable k is set indicate a number of bytes per sector, variable N is set to a disk count of participating disks, variables Q and P are set to zero, and index variables and j are set to zero. In step 612, byte[j] is read from disk i at sector S and written to disk[i][j]. Index variable j is then incremented by one. If, in step 614, j is less than k, the method proceeds to step 612.

Returning to step 614, if j is not less than k, the method proceeds to step 616, where index variable i is incremented by one and index variable j is set to zero. At this point, a set of N sectors comprising a stripe have been read from a set of N disks and stored in array disk[i][j]. If, in step 620, i is less than (N−2) then the method proceeds to step 612.

Returning to step 620, if i is not less than (N−2) then the method proceeds to step 622, where index variables i and j are set to zero. Steps 612 through 622 illustrate an exemplary means for loading array disk[i][j] from N disk drives. Persons skilled in the art will recognize that other techniques may be used for loading disk[i][j] without departing from the invention.

In step 624, P and Q erasure code bytes are calculated. P is set equal to P summed with disk[i][j] using an XOR operation. Q is set equal to Q summed with T[i][(disk[i][j])] using an XOR operation. The pre-computed table in array T[i][(disk[i][j])] provides the function $A^i \otimes b$ as a lookup operation, where b is the byte value of user data stored in disk[i][j]. Index variable i is then incremented by one. If, in step 630, index variable i is less than (N−2) then the method proceeds to step 624.

Returning to step 630, if index variable i is not less than (N−2) then the method proceeds to step 632, where disk[N−2][j] is written with P (one byte of P erasure code data) and disk[N−1][j] is written with the Q (one byte of Q erasure code data). Index variable j is then incremented by one. For simplicity of explanation, Sector S is equal to zero. However, persons skilled in the art will understand appropriate techniques for modifying which sector within an arbitrary stripe should store P erasure code data and which sector should store Q erasure code data. Hence, for an arbitrary stripe, the P and Q bytes may be stored in disk[i][j] locations other than i=(N−2) and i=(N−1), respectively. If, in step 640, index variable j is less than k, the method proceeds to step 624.

Returning to step 640, if index variable j is not less than k, then the method terminates in step 650. At this point, the sector storing Q erasure code bytes and the sector storing P erasure code bytes may be written to drives within the RAID-6 disk array or queued to be written at a later time.

The method steps 600 may be used when writing data into RAID-6 disk array 410. Alternatively, the method steps 600 may be used when re-computing sectors allocated to store P erasure code data and Q erasure code data.

FIG. 7 is a flow diagram of method steps 700 for reconstructing data from two failed drives using lookup tables, according to one embodiment of the invention. Although the method steps are described in conjunction with the systems of FIGS. 1-4, persons skilled in the art will understand that any system configured to perform the method steps, in any order, is within the scope of the invention.

Array disk[ ][ ] is assumed to have been initialized and populated previously with data bytes from a set of disk drives. Additionally, variable k is set to indicate a number of bytes per sector, and variable N is set to a disk count of participating disks.

The method begins in step 710, where index variables i and j are set to zero. In step 712, variable tmp1 is set equal to disk[N−1][j] and variable tmp2 is set equal to disk[N−2][j]. At this point tmp1 stores a byte of Q erasure code data and tmp2 stores a byte of P erasure code data. If, in step 720, index variable i is not equal to failed disk drive number x and i is not equal to failed disk drive number y, then the method proceeds to step 724. In step 724, variable tmp1 is set equal to tmp1 summed with T[i][disk[i][j]] using an XOR sum operation, and tmp2 is set equal to tmp2 summed with disk[i][j] using an XOR sum operation. The pre-computed table in array T[i][(disk[i][j])] provides the function $A^i \otimes b$ as a lookup operation, where b is the byte value of user data stored in disk[i][j]. Index variable i is then incremented by one. If, in step 730, index variable i is less than N−2 then the method proceeds to step 720.

Returning to step 720, if index variable i is equal to either failed disk drive number x or y, then them method proceeds to step 722, where index variable is incremented by one, thereby excluding the failed drive from being included in accumulated values for tmp1 and tmp2. The method then proceeds to step 730.

Returning to step 730, if index variable i is not less than (N−2), then the method proceeds to step 732. In step 732, variable tmp3 is set to a value looked up from pre-computed table invT[x][tmp1]. Variables tmp2 and tmp3 are then combined using an XOR operation and assigned to variable tmp4. Array variable disk[y][j], which represents byte j of a given sector within failed drive y, is then set to a value looked up from pre-computed table invlpT[y-x][tmp4]. At his point, user data byte j from failed drive y is recovered. Note that the difference "y−x" is computed using conventional integer arithmetic. Array variable disk[x][j], which represents user data byte j of a given sector within failed drive x, is then set to disk[y][j] combined with tmp2 using a an XOR operation. At this point, user data byte j from failed drive x is computed. Each byte j of the sector is now available, including bytes j from failed drives x and y.

In step 734, index variable j is incremented by one. If, in step 740, index variable j is less than k, then the method proceeds to step 712, otherwise the method terminates in step 790.

Persons skilled in the art will recognize that the techniques taught in terms of byte operations may be performed in parallel. For example, a processor with a 32-bit data path may perform four byte operations in parallel.

One embodiment of the invention may be implemented within RAID driver 156 of FIG. 1. In this embodiment, tables 158 comprise pre-computed tables T[i][b], invT[i][b], and invlpT[i][d]. Tables 158 may optionally include pre-computed table IpT[i][c]. Sectors of data from the disk array 114 are copied to system memory 104 in response to a disk read operation and written from system memory 104 to the disk array 114 in response to a disk write operation. RAID-6 computations are performed by the CPU 102 using tables 158, according to the teachings herein. Prior to normal operation, tables 158 need to be established. In one approach, the tables 158 are computed by CPU 102 prior to normal operation as part of an initialization phase of the RAID driver 156. In an alternative approach, the tables 158 are pre-computed once independent of the CPU 102, and loaded into system memory 104 along with other software components, such as the RAID driver 156.

In another embodiment of the invention, the techniques taught herein are implemented within software module 166 of FIG. 1. In this embodiment, tables 168 comprise pre-computed tables T[i][b], invT[i][b], and invlpT[i][d]. Tables 168 may optionally include pre-computed table IpT[i][c]. Sectors of data from the disk array 114 are copied to memory subsystem 164 in response to a disk read operation and written from memory subsystem 164 to the disk array 114 in response to a disk write operation. Data transactions to and from memory subsystem 164 may be further transmitted to system memory 104 for processing and use by applications executing on CPU 102. RAID-6 computations are performed by the processing unit 162 using tables 168, according to the teachings herein. Prior to normal operation, tables 168 need to be established. In one approach, the tables 168 are computed by either the CPU 102 or processing unit 162 and saved to tables 168 within memory subsystem 164 prior to normal operation as part of an initialization phase of the software module 166. In an alternative approach, the tables 168 are pre-computed once independently, and loaded into memory subsystem 164 along with other software components, such as the software module 166.

In yet another embodiment of the invention, the techniques taught herein are implemented within software module 176 of FIG. 1. In this embodiment, tables 178 comprise pre-computed tables T[i][b], invT[i][b], and invlpT[i][d]. Tables 178 may optionally include pre-computed table IpT[i][c]. Sectors of data from the disk array 114 are copied to memory subsystem 174 in response to a disk read operation and written from memory subsystem 174 to disk array 114 in response to a disk write operation. Data transactions to and from memory subsystem 174 may be further transmitted to system memory 104 for processing and use by applications executing on CPU 102. RAID-6 computations are performed by the parallel processing subsystem 112 using tables 178, according to the teachings herein. Prior to normal operation, tables 178 need to be established. In one approach, the tables 178 are computed by either the CPU 102 or parallel processing subsystem 112 and saved to tables 178 within memory subsystem 174 prior to normal operation as part of an initialization phase of the software module 176. In an alternative approach, the tables 178 are pre-computed once independently, and loaded into memory subsystem 174 along with other software components, such as the software module 176. The software module 176 may comprise a thread program configured to execute method steps 600 and 700 as thread groups executing within the processing cluster array 230 of FIG. 2. In one embodiment, individual threads are assigned to perform RAID-6 computations for an integral power of two bytes of sector byte data loaded into memory subsystem 174. The memory subsystem 174 may comprise PP memory 204, or on-chip memory, or any combination thereof. In one embodiment, each pre-computed table within tables 178 is stored on-chip within the PPU 202 as a 256×256 texture map.

RAID-6 Computation on a GPU Co-Processor

Figure 8:
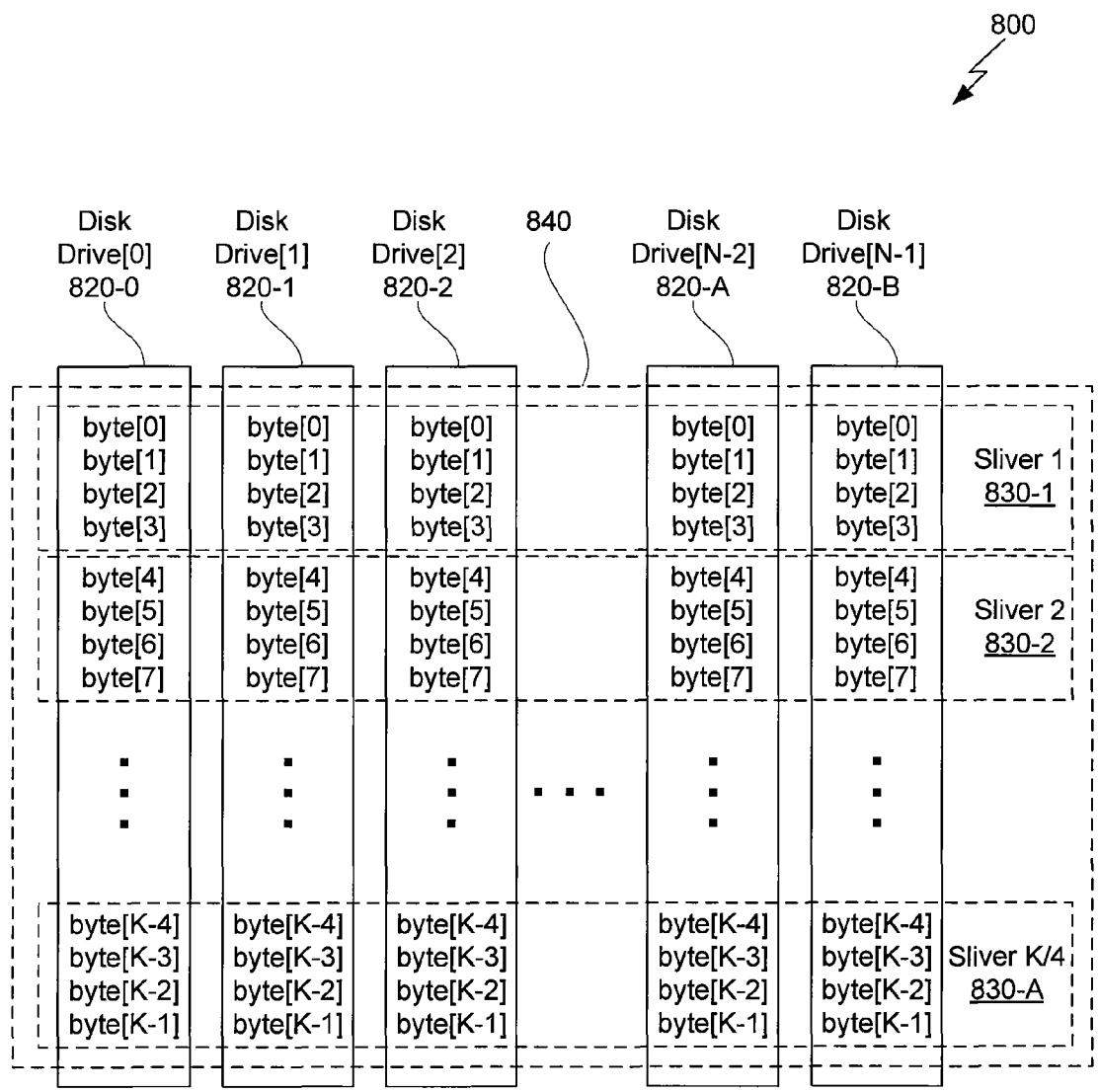
FIG. 8 illustrates a stripe of data organized as a set of slivers that are distributed over a set of independent disk drives within a RAID-6 disk array, according to one embodiment of the present invention.

FIG. 8 illustrates a stripe of data 840 organized as a set of slivers 830 that are distributed over a set of independent disk drives 820 within a RAID-6 disk array 800, according to one embodiment of the present invention. The stripe of data 840 is loaded into an on-chip cache that is accessible to each SPM 310 within a GPC 208 of FIG. 3A for processing. For example the stripe of data 840 can be loaded into L2 cache 350 of FIG. 3B or L1 cache 320 prior to processing. RAID-6 disk array 800 comprises N disks.

As described previously, bytes of data protected by RAID-6 codes are related horizontally (of equal offset) among disk drives 820, but are independent with respect to RAID-6 encoding otherwise. In other words, bytes[0] in disk drive[0] 820-0 through disk drive[N−1] 820-B are related with respect to RAID-6 codes and can be computed independently of other bytes within the stripe of data 840. In one embodiment, four groups of horizontally related bytes comprise a sliver of data 830 within the stripe of data 840. That is, bytes[0 . . . 3] in disk drive[0] 820-0 through disk drive[N−1] 820-B comprise sliver 830-1, bytes[4 . . . 7] in disk drive[0] 820-0 through disk drive[N−1] 820-B comprise sliver 830-2, and so forth. In one embodiment of the present invention, each sliver 830 is assigned to a different thread for processing within a GPC 208.

Data in a typical disk system is organized into sectors, which represent a minimum quantum of data storage and access. Each sector commonly comprises 4096 bytes. Thus, in one embodiment K is equal to 4096, representing a sector size of 4096 bytes in each disk 820. With K equal to 4096, 1024 threads are assigned to perform RAID-6 computations on the stripe of data 840. Each thread processes four bytes from each disk drive 820. Persons skilled in the art will understand that other values of K may also be used without departing from the scope of the invention.

Figure 9A:
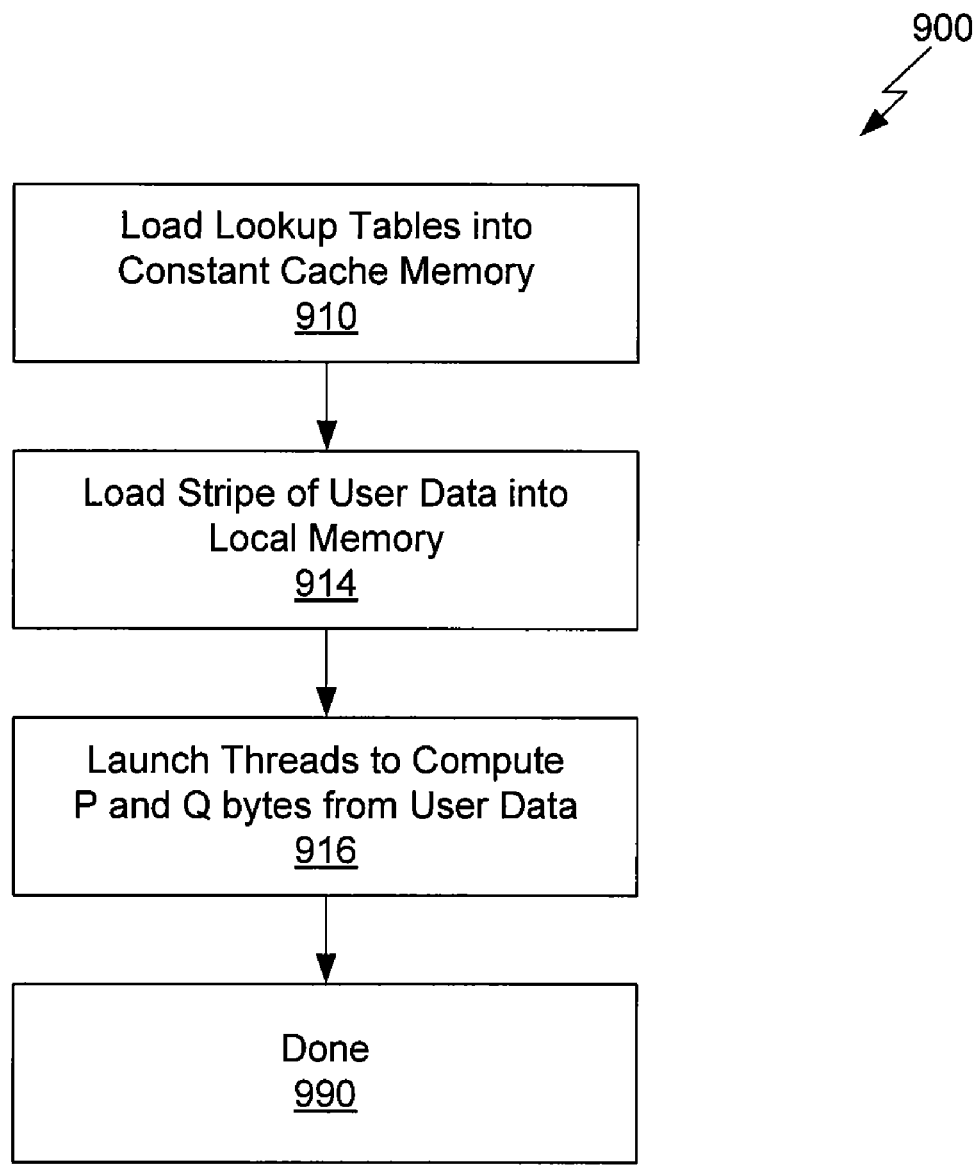
FIG. 9A is a flow diagram of method steps for generating erasure codes for a RAID-6 array, according to one embodiment of the invention.

FIG. 9A is a flow diagram of method steps 900 for generating erasure codes for a RAID-6 array, according to one embodiment of the invention. Although the method steps are described in conjunction with the systems of FIGS. 1-4, persons skilled in the art will understand that any system configured to perform the method steps, in any order, is within the scope of the invention.

The method begins in step 910, where a PPU 202 of FIG. 2 loads a set of lookup tables into constant cache memory. The set of lookup tables comprises the arrays described in FIGS. 5A-5C. The set of lookup tables includes, without limitation, T, invT, and invlpT. In one embodiment, a single instance of each lookup table is loaded into constant cache memory. In alternate embodiments, a plurality of instances of each lookup table is loaded into constant cache memory. For example, an instance of the lookup tables may be loaded for each thread assigned to process a sliver of RAID-6 data.

In step 914, a GPC 208 loads a stripe of user data into local memory for processing. The stripe of user data is stored in array disk[] [] in local memory. Each individually addressed element of array disk[] [] corresponds to one byte of data. In an alternative embodiment, the RAID driver 156 of FIG. 1, executing on CPU 102, loads the stripe of user data into GPU local memory.

In step 916, the work distribution unit 200 launches threads within at least one GPC 208 to compute P and Q bytes for the stripe user data. In one embodiment, K/4 threads are launched to process the stripe of user data, where each thread processes four bytes from each strip associated with each disk drive 820 of FIG. 8. Each thread computes a set of four P bytes and four Q bytes for a corresponding sliver of data and stores the four P bytes and four Q bytes within the array disk[] []. The method terminates in step 990. The data stored in array disk [] [] may be written to disk array 114 of FIG. 1 using any technically feasible technique. Each on of the threads launched by work distribution unit 200 executes method steps described in FIG. 9B, below.

Figure 9B:
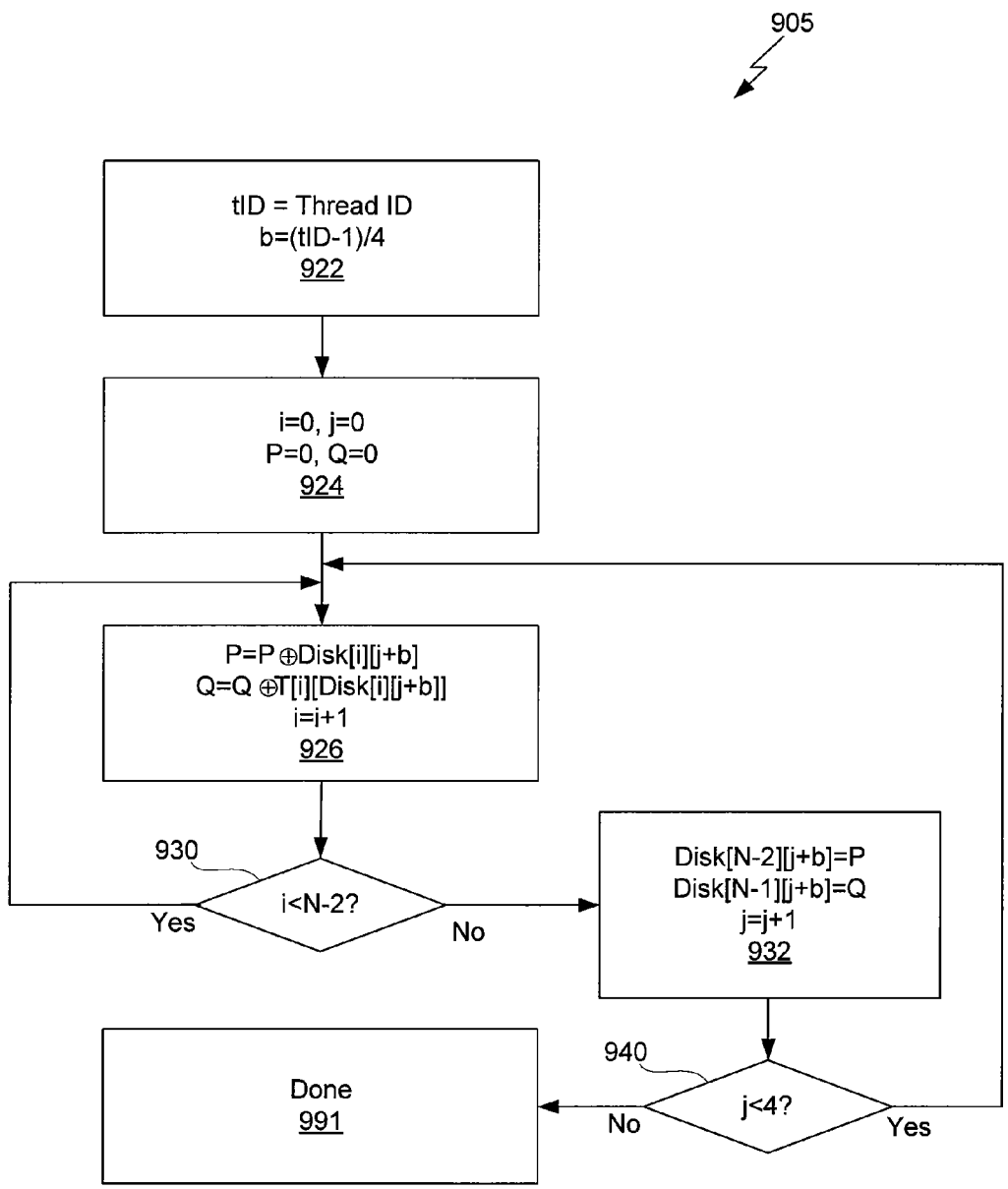
FIG. 9B is a flow diagram of method steps for generating erasure code bytes for one sliver using one thread within a multi-threaded processor, according to one embodiment of the invention.

FIG. 9B is a flow diagram of method steps 905 for generating erasure code bytes for one sliver using one thread within a multi-threaded processor, according to one embodiment of the invention. Although the method steps are described in conjunction with the systems of FIGS. 1-4, persons skilled in the art will understand that any system configured to perform the method steps, in any order, is within the scope of the invention. The method is performed by a thread executing on a GPC 208. By executing method steps 905, the thread computes P and Q erasure bytes for one sliver of data 830 of FIG. 8. In a practical implementation, a plurality of threads execute in parallel on at least one GPC 208 to compute P and Q erasure bytes for a plurality of slivers comprising the slice 840.

The method begins in step 922, where the thread assigns a thread identification number (thread ID) to variable tID. The thread also sets a byte offset, represented by variable "b," equal to the thread ID minus one, divided by four. The thread may use the byte offset "b" to access each byte assigned to the thread for processing within a corresponding sliver. In step 924, the thread assigns variables "i," "j," "P," and "Q" to zero. Variable "i" is an array index used to select a disk drive 820, when accessing disk[] []. For example, when "i" is zero, disk drive 820-0 is selected, when "i" is one, disk drive 820-1 is selected, and so forth. Variable "j" is an array index used to select a byte, relative to byte offset "b," within a selected disk drive 820. Variables "P" and "Q" each represent one corresponding RAID-6 erasure byte.

In step 926, the thread computes one P byte and one Q byte. The P byte is computed using an XOR operation performed between the current P byte value and a byte value corresponding to one byte of user data stored in disk[i][j+b]. The Q byte is computed using an XOR operation performed between the current Q byte value and a byte stored in array T[i][disk[i][j+b]]. The first index into T[] [] is given by the value of variable "i," and the second index into T[] [] is given by the value of a byte stored at byte offset "j+b" in a disk drive 820, given by the value of variable "i."

If, in step 930, variable "i" is not less than N−2, then variable "i" is not addressing user data and the method proceeds to step 932. Again, the value of N represents how many disks comprise RAID-6 disk array 800. In step 932, one P byte is stored in disk[N−2][j+b] and one Q byte is stored in disk[N−1][j+b]. Also in step 932, variable "j" is incremented by one. Variable "j" is used as an index to address sequential bytes within a disk sector stored in disk[] []. In one embodiment, each thread accesses four bytes, and variable "j" ranges from zero to three to facilitate access to the four bytes.

If, in step 940, variable "j" is less than four, the method proceeds to step 926. If, instead, variable "j" is not less than four, the method terminates in step 991.

Returning to step 930, of variable "i" is less than N−2, then variable "i" is addressing user data and the method proceeds to step 926.

Persons skilled in the art will recognize that, although the method steps 905 are associated with a particular sector layout within stripe 840, other sector layouts, such as the sector layout illustrated in FIG. 4, may be used without departing the scope of the present invention.

Figure 10A:
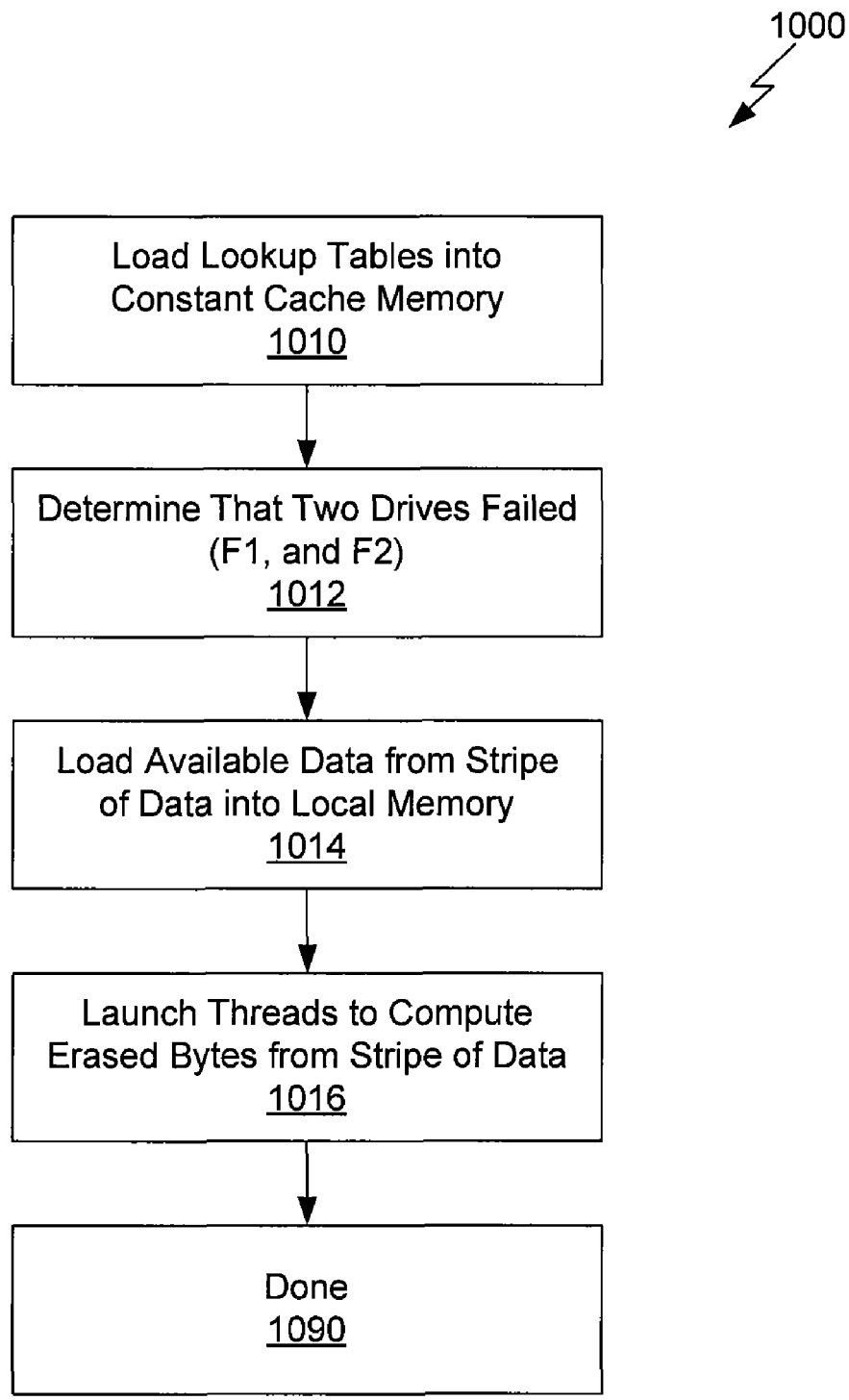
FIG. 10A is a flow diagram of method steps for recovering erased user data from a RAID-6 array, according to one embodiment of the invention.

FIG. 10A is a flow diagram of method steps 1000 for recovering erased user data from a RAID-6 array, according to one embodiment of the invention. Although the method steps are described in conjunction with the systems of FIGS. 1-4, persons skilled in the art will understand that any system configured to perform the method steps, in any order, is within the scope of the invention.

The method begins in step 1010, where a PPU 202 of FIG. 2 loads a set of lookup tables into constant cache memory. The set of lookup tables comprises the arrays described in FIGS. 5A-5C. The set of lookup tables includes, without limitation, T, invT, and invlpT. In one embodiment, a single instance of each lookup table is loaded into constant cache memory. In alternate embodiments, a plurality of instances of each lookup table is loaded into constant cache memory. For example, an instance of the lookup tables may be loaded for each thread assigned to process a sliver of RAID-6 data.

In step 1012, the RAID driver 156 of FIG. 1, executing on the CPU 102, determines that two drives have failed. F1 indicates a drive number for a first of the two failed drives. F2 indicates a drive number for a second of the two failed drives. In alternative embodiments, GPC 208 of FIG. 2 determines that two drives have failed.

In step 1014, a GPC 208 loads a stripe of data 840 into local memory for processing. The stripe of data 840 is stored in array disk[ ] [ ] in local memory. Each individually addressed element of array disk[ ] [ ] corresponds to one byte of data. In an alternative embodiment, the RAID driver 156 of FIG. 1, executing on CPU 102, loads the stripe of user data into GPU local memory.

In step 1016, the work distribution unit 200 launches threads within at least one GPC 208 to compute erased bytes for the stripe data 840. In one embodiment, K/4 threads are launched to process the stripe of data 840, where each thread processes four bytes from each strip associated with each disk drive 820 of FIG. 8. Each thread computes a set of four recovered bytes for each erased disk drive within a corresponding sliver of data. The thread stores the recovered bytes within the array disk[ ] [ ]. The method terminates in step 1090. Each on of the threads launched by work distribution unit 200 executes method steps described in FIG. 10B, below.

In a recovery scenario, where new a disk drive has replaced each failed (erased) disk drive, the data stored in array disk[ ] [ ] may be written to disk array 114 of FIG. 1 using any technically feasible technique. Persons skilled in the art will recognize that the method 1000 may be used to enable continued operation of disk array 114 with two erased drives. The method 1000 may also be used to re-build disk array 114 after two failed drives have been replaced with properly operating disk drives. Furthermore, the method 1000 may be used to concurrently enable continued operation as well as rebuilding disk array 114 after failed drives have been replaced.

Figure 10B:
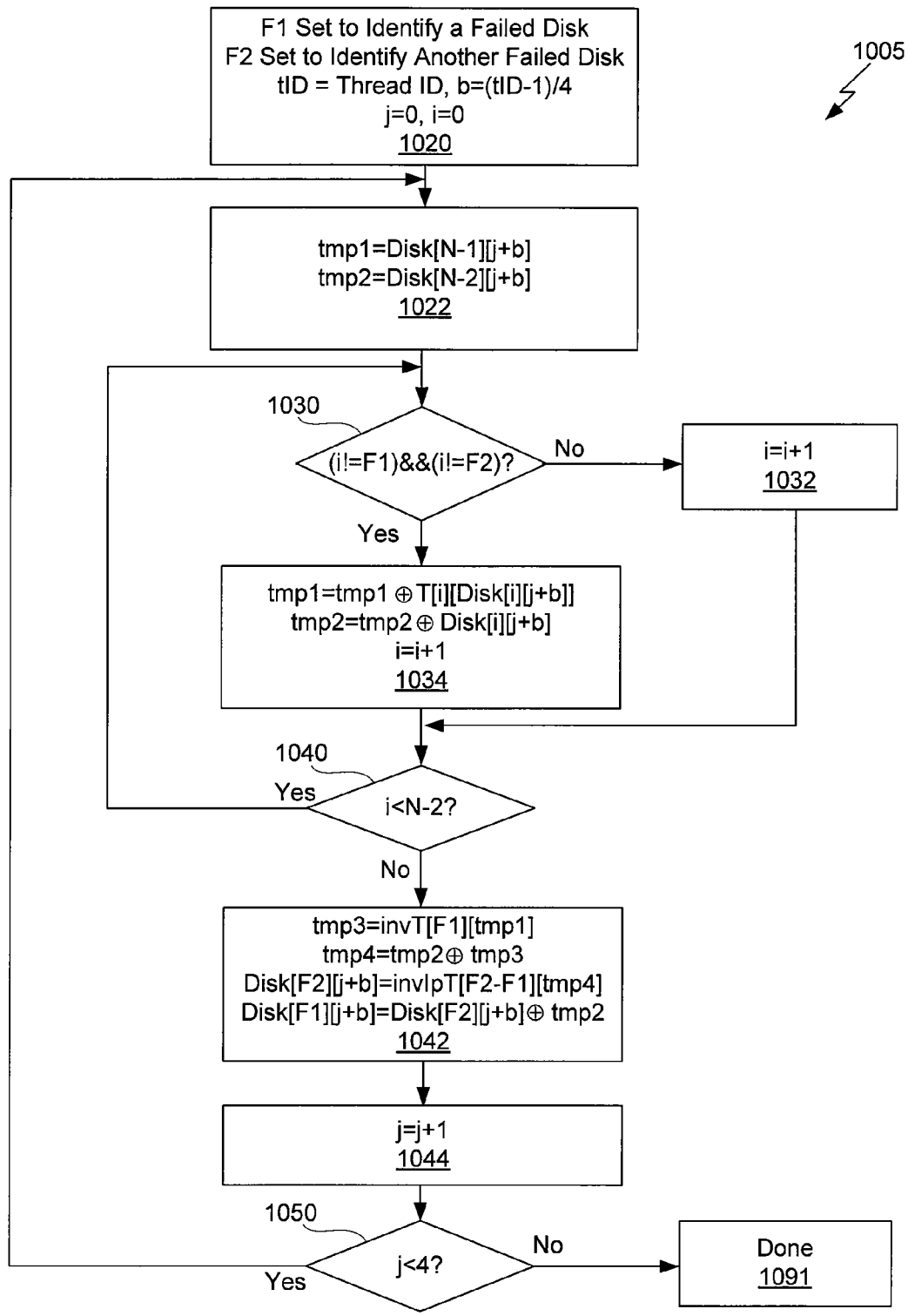
FIG. 10B is a flow diagram of method steps for recovering erased user data for one sliver using one thread within a multi-threaded processor, according to one embodiment of the invention.

FIG. 10B is a flow diagram of method steps 1005 for recovering erased user data for one sliver using one thread within a multi-threaded processor, according to one embodiment of the invention. Although the method steps are described in conjunction with the systems of FIGS. 1-4, persons skilled in the art will understand that any system configured to perform the method steps, in any order, is within the scope of the invention. The method steps 1005 are performed by a thread executing on a GPC 208. By executing method steps 1005, the thread computes two erased bytes for one sliver of data 830 of FIG. 8. In a practical implementation, a plurality of threads execute in parallel on at least one GPC 208 to compute two erased bytes for a plurality of slivers comprising the slice 840.

The method begins in step 1020, where the thread sets variable F1 to identify a failed disk and variable F2 to identify another failed disk. The thread also sets variable tID to a thread identification number (thread ID). The thread also sets a byte offset, represented by variable "b," equal to the thread ID minus one, divided by four. The thread may use the byte offset "b" to access each byte assigned to the thread for processing within a corresponding sliver. The thread assigns variables "i" and "j" to zero. Variable "i" is an array index used to select a disk drive 820, when accessing disk[ ] [ ]. For example, when "i" is zero, disk drive 820-0 is selected, when "i" is one, disk drive 820-1 is selected, and so forth. Variable "j" is an array index used to select a byte, relative to byte offset "b," within a selected disk drive 820.

In step 1022, variable tmp1 is set equal to disk[N−1][j+b] and variable tmp2 is set equal to disk[N−2][j+b]. At this point tmp1 stores a byte of Q erasure code data and tmp2 stores a byte of P erasure code data. If, in step 1030, index variable "i" is not equal to failed disk drive number F1 and "i" is not equal to failed disk drive number F2, then the method proceeds to step 1034. In step 1034, variable tmp1 is set equal to tmp1 summed with T[i][disk[i][j+b]] using an XOR sum operation, and tmp2 is set equal to tmp2 summed with disk[i][j+b] using an XOR sum operation. The pre-computed table in array T[i][(disk[i][j+b])] provides the function $A^i \otimes d$ as a lookup operation, where d is the byte value of user data stored in disk[i][j+b]. Index variable "i" is then incremented by one. If, in step 1040, index variable "i" is not less than N−2, then the method proceeds to step 1042.

In step 1042, variable tmp3 is set to a value looked up from pre-computed table invT[x][tmp1]. Variables tmp2 and tmp3 are then combined using an XOR operation and assigned to variable tmp4. Array variable disk[F2][j+b], which represents byte j+b of a given sector within failed drive F2, is then set to a value looked up from pre-computed table invlpT[F2-F1][tmp4]. At his point, user data byte j+b from failed drive F2 is recovered. Note that the difference "F2−F1" is computed using conventional integer arithmetic. Array variable disk[F1][j+b], which represents user data byte j+b of a given sector within failed drive F1, is then set to disk[F2][j+b] combined with tmp2 using a an XOR operation. At this point, user data byte j+b from failed drive F1 is computed. Each byte j+b of the sector is now available, including bytes j+b from failed drives F1 and F2.

In step 1044, index variable "j" is incremented by one. If, in step 1050, index variable "j" is less than 4, then the method proceeds to step 1022, otherwise the method terminates in step 1091.

Returning to step 1030, if index variable "i" is equal to either failed disk number F1 or F2, then the method proceeds to step 1032, where index variable "i" is incremented by one, thereby excluding the failed drive from being included in the accumulated values for tmp1 and tmp2. The method then proceeds to step 1040.

Returning to step 1040, if index variable "i" is less than (N−2), then the method proceeds to step 1030.

In sum, a technique for performing efficient RAID-6 computations on a multi-threaded processor is disclosed. The technique pre-computes complex arithmatic calculations and stores four two-dimensional tables. Each table accepts two eight-bit input indices and generates one eight-bit output. With three of the four tables available, RAID-6 computation complexity is reduced from complex Galois Field arithmetic to simple bit-wise XOR summation, integer subtraction, and byte table lookups. A set of threads within a multi-threaded processor are configured to perform RAID-6 computations on a sliver of data within a RAID-6 stripe. In one embodiment, each thread performs RAID-6 computations on four bytes per disk drive within a sliver of data and retireves pre-computed data from lookup tables stored in a constant cache.

One advantage of the present invention is that otherwise complex RAID-6 computations are simplified to efficient arithmetic instructions and basic table lookup operations, thereby reducing computational complexity and improving overall system efficiency. When implemented on an appropriate multi-threaded processor platform, significant system performance improvements may be achieved.

Persons skilled in the art will readily recognize that the techniques taught herein for performing RAID-6 computations may be implemented as customized fixed-function hardware or as a software program executing on an appropriately configured hardware system.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

We claim:

1. A computer-implemented method for computing erasure codes for a redundant array of independent disks (RAID), the method comprising:
    storing user data associated with a RAID stripe that is defined by a data block common to each disk in the redundant array, wherein, for each byte offset within the data block, user data associated with only N−2 disks is stored, N being the number of disks in the redundant array, and wherein a sliver comprises a set of S bytes per disk within the RAID stripe at a common sliver offset within each disk;
    calculating a sliver offset for accessing an assigned sliver based on a thread identification number;
    for each byte offset within the assigned sliver, computing a first erasure code by accumulating a plurality of values generated by performing, across each disk in the redundant array, a first exclusive-or operation based on the byte offset within the data block;
    for each byte offset within the assigned sliver, computing a second erasure code by accumulating a plurality of values generated by performing, across each disk in the redundant array, a second exclusive-or operation based on a look-up table value; and
    for each byte offset within the assigned sliver, storing the first erasure code and the second erasure code along with the user data associated with the N−2 disks.

2. The method of claim 1, wherein the first erasure code and the second erasure code are used to recover user data lost when any one disk in the redundant array fails or when any two disks in the redundant array fail.

3. The method of claim 1, wherein the redundant array is configured as a RAID 6 array, and S is an integral power of two.

4. The method of claim 1, wherein, for each byte offset within the assigned sliver, the look-up table value is based on an identifier for a first disk in the redundant array and a byte value stored on the first disk at the byte offset within the assigned sliver.

5. The method of claim 1, wherein each look-up table value is included in a first look-up table that stores the results of Galois operations performed on a plurality of eight-bit numbers, wherein a first eight-bit number identifies a disk in the redundant array, and a second eight-bit number comprises a byte of user data stored on the identified disk.

6. The method of claim 5, wherein the first look-up table is stored in memory local to a graphics processing unit.

7. The method 6, wherein the user data is stored in the memory local to the graphics processing unit or in a frame buffer memory coupled to the graphics processing unit.

8. The method of claim 5, further comprising the step of generating a first recovery code value based on the first erasure code and valid stored user data.

9. The method of claim 8, further comprising the step of generating a second recovery code value by extracting one or more values from the first look-up table, the second erasure code, the first recovery code, an extracted value from a second look-up table, and the valid stored user data.

10. The method of claim 9, further comprising the step of recovering data lost on a first failed disk in the redundant array via extracting data from a third look-up table based on the second recovery code value, the identifier for the first disk, and an identifier for a second failed disk.

11. The method of claim 10, further comprising the step of recovering data lost on the second failed disk in the redundant array based on the first recovery code and data recovered from the first failed disk.

12. The method of claim 10, wherein the second look-up table and the third look-up table are stored in memory local to a graphics processing unit.

13. The method of claim 1, wherein the steps of calculating, computing the first erasure code, computing the second erasure code, and storing the first and second erasure codes are performed by a thread associated with the thread identification number executing on a processing unit.

14. A computer-readable medium including instructions that, when executed by a processing unit, cause the processing unit to compute erasure codes for a redundant array of independent disks (RAID), by performing the steps of:
    storing user data associated with a RAID stripe that is defined by a data block common to each disk in the redundant array, wherein, for each byte offset within the data block, user data associated with only N−2 disks is stored, N being the number of disks in the redundant array, and wherein a sliver comprises a set of S bytes per disk within the RAID stripe at a common sliver offset within each disk;
    calculating a sliver offset for accessing an assigned sliver based on a thread identification number;
    for each byte offset within the assigned sliver, computing a first erasure code by accumulating a plurality of values generated by performing, across each disk in the redundant array, a first exclusive-or operation based on the byte offset within the data block;
    for each byte offset within the assigned sliver, computing a second erasure code by accumulating a plurality of values generated by performing, across each disk in the redundant array, a second exclusive-or operation based on a look-up table value; and
    for each byte offset within the assigned sliver, storing the first erasure code and the second erasure code along with the user data associated with the N−2 disks.

15. The computer-readable medium of claim 14, wherein the first erasure code and the second erasure code are used to recover user data lost when any one disk in the redundant array fails or when any two disks in the redundant array fail.

16. The computer-readable medium of claim 14, wherein, for each byte offset within the assigned sliver, the look-up table value is based on an identifier for a first disk in the redundant array and a byte value stored on the first disk at the byte offset within the assigned sliver.

17. The computer-readable medium of claim 14, wherein each look-up table value is included in a first look-up table that stores the results of Galois operations performed on a plurality of eight-bit numbers, wherein a first eight-bit number identifies a disk in the redundant array, and a second eight-bit number comprises a byte of user data stored on the identified disk.

18. The computer-readable medium of claim 17, wherein the first look-up table is stored in memory local to a graphics processing unit.

19. The computer-readable medium of claim 18, wherein the user data is stored in the memory local to the graphics processing unit or in a frame buffer memory coupled to the graphics processing unit.

20. The computer-readable medium of claim 17, further comprising the step of generating a first recovery code value based on the first erasure code and valid stored user data.

21. The computer-readable medium of claim 20, further comprising the steps of generating a second recovery code value by extracting one or more values from the first look-up table, the second erasure code, the first recovery code, an extracted value from a second look-up table, and the valid stored user data; and, recovering data lost on a second failed disk in the redundant array via extracting data from a third look-up table based on the second recovery code value, the identifier for the first disk, and an identifier for the second failed disk.

22. The computer-readable medium of claim 21, further comprising the step of recovering data lost on the second failed disk in the redundant array based on the first recovery code and data recovered from the first failed disk.

23. The computer-readable medium of claim 21, wherein the second look-up table and the third look-up table are stored in memory local to a graphics processing unit.

24. The computer-readable medium of claim 14, wherein the steps of calculating, computing the first erasure code, computing the second erasure code, and storing the first and second erasure codes are performed by a thread associated with the thread identification number executing on a processing unit.

25. A computer system, comprising:
a central-processing unit;
a multi-threaded processing unit coupled to the central-processing unit;
a system memory coupled to the central processing unit and the multi-threaded processing unit; and
a redundant array of independent disks (RAID) coupled to the central processing unit, multi-threaded processing unit, and the system memory,
wherein the multi-threaded processing unit is configured to compute erasure codes for the redundant array by performing the steps of:
  storing user data associated with a RAID stripe that is defined by a data block common to each disk in the redundant array, wherein, for each byte offset within the data block, user data associated with only N−2 disks is stored, N being the number of disks in the redundant array, and wherein a sliver comprises a set of S bytes per disk within the RAID stripe at a common sliver offset within each disk;
  calculating a sliver offset for accessing an assigned sliver based on a thread identification number;
  for each byte offset within the assigned sliver, computing a first erasure code by accumulating a plurality of values generated by performing, across each disk in the redundant array, a first exclusive-or operation based on the byte offset within the data block;
  for each byte offset within the assigned sliver, computing a second erasure code by accumulating a plurality of values generated by performing, across each disk in the redundant array, a second exclusive-or operation based on a look-up table value; and
  for each byte offset within the assigned sliver, storing the first erasure code and the second erasure code along with the user data associated with the N−2 disks.

* * * * *